United States Patent
Cheng et al.

(10) Patent No.: US 12,272,604 B2
(45) Date of Patent: *Apr. 8, 2025

(54) INTEGRATED CIRCUIT DEVICE WITH LOW THRESHOLD VOLTAGE

(71) Applicant: Taiwan Semiconductor Manufacturing Co., Ltd., Hsinchu (TW)

(72) Inventors: Chung-Liang Cheng, Changhua County (TW); Ziwei Fang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/439,362

(22) Filed: Feb. 12, 2024

(65) Prior Publication Data

US 2024/0186189 A1 Jun. 6, 2024

Related U.S. Application Data

(60) Continuation of application No. 17/750,579, filed on May 23, 2022, now Pat. No. 11,901,241, which is a
(Continued)

(51) Int. Cl.
| | |
|---|---|
| *H01L 21/8238* | (2006.01) |
| *H01L 21/02* | (2006.01) |
| *H01L 21/28* | (2006.01) |
| *H01L 27/092* | (2006.01) |
| *H01L 29/423* | (2006.01) |

(Continued)

(52) U.S. Cl.
CPC ........ *H01L 21/823828* (2013.01); *H01L 21/02172* (2013.01); *H01L 21/02183* (2013.01); *H01L 21/0228* (2013.01); *H01L 21/02458* (2013.01); *H01L 21/28008* (2013.01); *H01L 21/823821* (2013.01); *H01L 27/0924* (2013.01); *H01L 29/42356* (2013.01); *H01L 29/66795* (2013.01);
(Continued)

(58) Field of Classification Search
CPC ........ H01L 21/02172; H01L 21/02183; H01L 21/0228; H01L 21/02458; H01L 21/28008; H01L 21/823821; H01L 21/823828; H01L 27/0922; H01L 27/0924; H01L 27/1211; H01L 29/42356; H01L 29/42392; H01L 29/66795; H01L 29/785; H01L 29/78696
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Cheung Lee
(74) *Attorney, Agent, or Firm* — HAYNES AND BOONE, LLP

(57) ABSTRACT

A method of manufacturing a semiconductor device is provided. A substrate is provided. The substrate has a first region and a second region. An n-type work function layer is formed over the substrate in the first region but not in the second region. A p-type work function layer is formed over the n-type work function layer in the first region, and over the substrate in the second region. The p-type work function layer directly contacts the substrate in the second region. And the p-type work function layer includes a metal oxide.

20 Claims, 24 Drawing Sheets

Related U.S. Application Data division of application No. 16/573,866, filed on Sep. 17, 2019, now Pat. No. 11,342,231.

(51) Int. Cl.
*H01L 29/66* (2006.01)
*H01L 29/78* (2006.01)
*H01L 29/786* (2006.01)

(52) U.S. Cl.
CPC ...... *H01L 29/785* (2013.01); *H01L 29/78696* (2013.01)

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,816,444 B2 | 8/2014 | Wann et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,860,148 B2 | 10/2014 | Hu et al. | |
| 8,962,400 B2 | 2/2015 | Tsai et al. | |
| 8,963,258 B2 | 2/2015 | Yu et al. | |
| 9,093,514 B2 | 7/2015 | Tsai et al. | |
| 9,093,530 B2 | 7/2015 | Huang et al. | |
| 9,105,490 B2 | 8/2015 | Wang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 9,548,303 B2 | 7/2017 | Lee et al. | |
| 9,923,065 B2 | 3/2018 | Xie et al. | |
| 10,049,940 B1 | 8/2018 | Chen et al. | |
| 2007/0138559 A1 | 6/2007 | Bohr | |
| 2011/0062526 A1 | 3/2011 | Xu et al. | |
| 2012/0244669 A1 | 9/2012 | Liao | |
| 2016/0322471 A1 | 11/2016 | JangJian et al. | |
| 2020/0043808 A1* | 2/2020 | Bao | H01L 21/28088 |

\* cited by examiner

INTEGRATED CIRCUIT DEVICE WITH LOW THRESHOLD VOLTAGE

PRIORITY DATA

The present application is a continuation application of U.S. patent application Ser. No. 17/750,579, filed on May 23, 2022, entitled "Integrated Circuit Device With Low Threshold Voltage", which is a divisional application of U.S. patent application Ser. No. 16/573,866, filed on Sep. 17, 2019, entitled "Integrated Circuit Device With Low Threshold Voltage", the disclosures of each which have been hereby incorporated by reference in their respective entireties.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of IC processing and manufacturing and, for these advances to be realized, similar developments in IC processing and manufacturing are needed. For example, transistors, which is one of the variety of circuit device components of ICs, generally benefits from low threshold voltages as their sizes become smaller. However, the existing methods of reducing the threshold voltage have been approaching their limit. It is desirable to find new ways to further reduce the threshold voltage without adversely affecting other aspects of the transistor.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
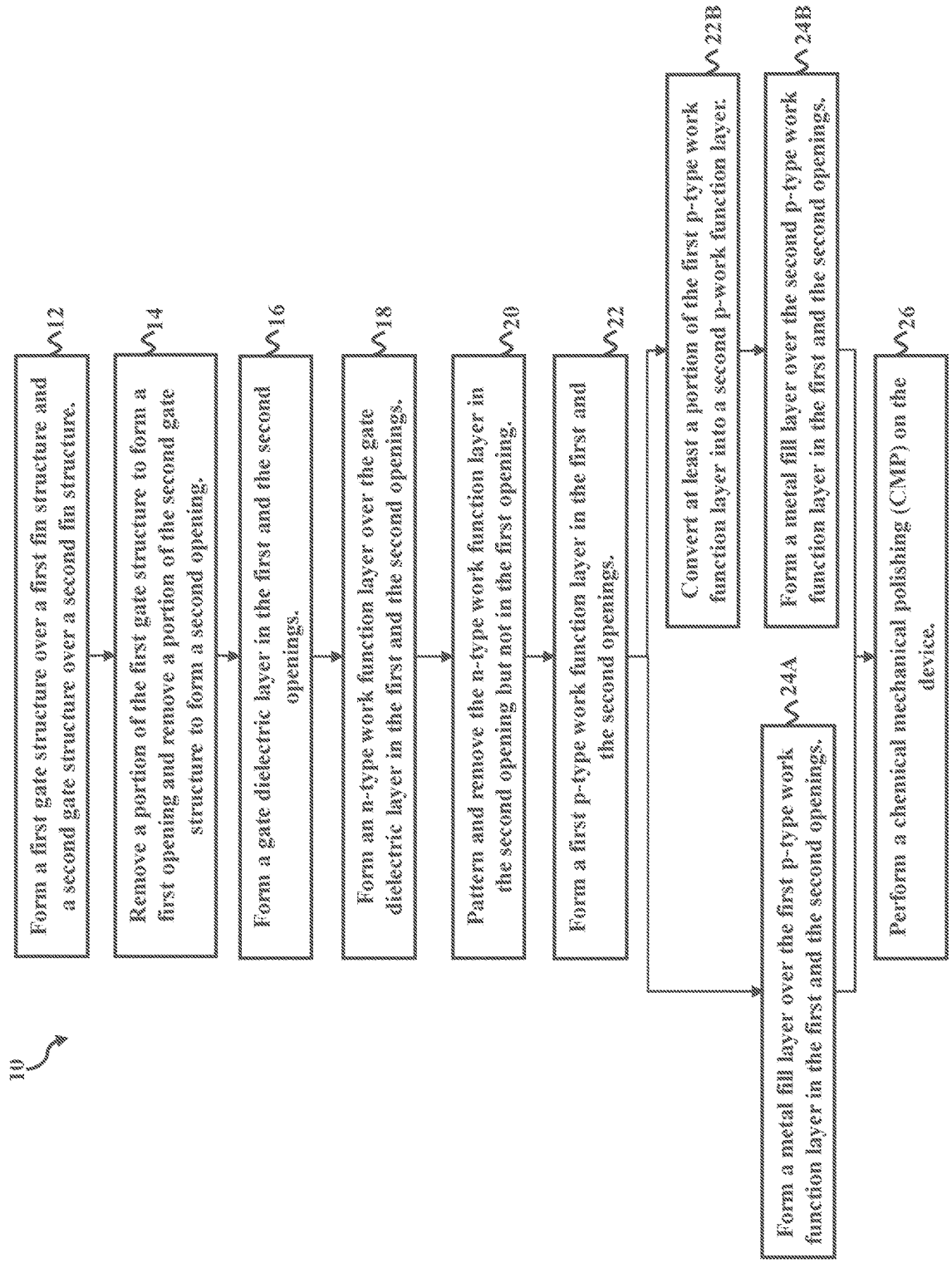
FIG. 1 is a flow chart of a method for fabricating an IC device according to various aspects of the present disclosure.

The present disclosure relates generally to integrated circuit (IC) devices, and more particularly, to IC devices with ultra-low threshold voltage.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

At its most basic, a transistor may include a semiconductor material doped to form source/drain features separated by a channel region. A gate structure is disposed on the channel region and includes a gate electrode and a gate dielectric that separates the gate electrode from the channel region. While any suitable gate electrode may be used, many examples of the present disclosure use a p-type high work function metal for the purpose of reducing threshold voltage, and/or optimizing the operation of the transistor.

As described above, it is desirable to find new ways to reduce the threshold voltage without adversely affecting other aspects of the transistor. Furthermore, for advanced technologies beyond 3 nm technology node, an ultra-low threshold voltage is often needed. Threshold voltage is largely determined by the difference in work function between the transistor channel semiconductor and the gate electrode. For a p-type device, a reduced threshold voltage may be achieved by utilizing a metal with a sufficiently high work function such that the electrode work function approaches the valence band edge of the channel semiconductor.

One way to achieve this increased work function of the gate electrode is by introducing dopants into the p-type work function layer of the gate electrode. However, doping processes often lead to shadowing effect that degrades device performance. Alternatively, the increased work function may be realized by a larger thickness of the p-type work function metal layer. The efficacy of this approach, however, quickly approaches its limit as the available spacing for the various device components shrink in newer technologies. Furthermore, a thicker work function layer inevitably leads to reduced dimensions to accommodate other components of the device thereby causing issues elsewhere in the processing scheme. A third approach is to form a thin layer with a high p-type work function. The limitation there is that, at a low thickness, surface oxidation often leads to a shift of work function towards the mid gap of the semiconductor, thereby increasing the threshold voltage. Such oxidations may also cause the work function material to lose its conductor characteristics and to fail as part of the gate electrode. Therefore, it remains a challenge to achieve ultra-low threshold voltage for a p-type device.

One or more embodiments of the present disclosure overcome the aforementioned issues by providing structures and methods to form ultra-thin metal oxides as the metal gate electrode of a p-type metal-oxide-semiconductor (MOS) device, that has an ultra-low threshold voltage. The structure may include a layer of ultra-thin metal oxide as part of the gate electrode. As described in details below, the method includes a deposition process of a p-type work function metal film; forming an in-situ capping layer; and conducting an ex-situ oxygen plasma treatment process on the capping layer to transform metal film into a metal oxide film. The p-type work function metal may have a work function above approximately 4.9-5.1 eV, thus close to the band edge of the semiconductor substrate.

In addition to solving the aforementioned issues, one or more embodiments of the present disclosure provide many benefits to a semiconductor device and the formation thereof. For example, by providing a method to achieve ultra-low threshold voltage, an important scaling factor to maintain power efficiency, this disclosure provides a method for achieving more efficient device performance. For another example, by providing a method that uses ultra-thin work function metals, thereby widening the gate filling window, the disclosure provides a method of reducing gate resistance for device performance improvement. The adoption of the method disclosed in the present disclosure may also simplify the fabrication processes and reduce production cost.

Various methods for forming gate stacks and related gate structures are disclosed herein, which may be implemented in any of a variety of device types. For example, aspects of the present disclosure may be implemented to form gate stacks suitable for planar field-effect transistors (FETs), multi-gate transistors (planar or vertical), such as fin-like FET (FinFET) devices, gate-all-around (GAA) devices, omega-gate (Ω-gate) devices, or pi-gate (Π-gate) devices, as well as strained-semiconductor devices, silicon-on-insulator (SOI) devices, partially-depleted SOI devices, fully-depleted SOI devices, or other devices. The present disclosure contemplates that one of ordinary skill may recognize other IC devices that can benefit from the gate formation methods and/or gate structures described herein.

FIG. 1 is a flow chart of a method 10 for fabricating an IC device according to various aspects of the present disclosure. At block 12, method 10 includes forming a first gate structure over a first fin structure, for example, in an n-type region, and a second gate structure over a second fin structure, for example, in a p-type region. At block 14, method 10 includes removing a portion of the first gate structure thereby forming a first opening, and removing a portion of the second gate structure thereby forming a second opening. In some implementations, a dummy gate stack (including, for example, a polysilicon gate electrode) is removed from the gate structure. At block 16, method 10 includes forming a gate dielectric layer, such as a high-k dielectric layer, in the first and the second openings.

At block 18, method 10 includes forming an n-type work function metal layer over the gate dielectric layer in both the first and the second openings. At block 20, method 10 includes patterning the n-type work function metal layer and removing the n-type work function metal layer from the p-type regions (for example, the second opening). At block 22, method 10 includes forming a p-type work function layer in both the first and the second openings, for example, over the n-type work function metal layer the n-type region, and over the gate dielectric layer in the p-type region. In some implementations, a capping layer is deposited over the p-type work function layer. At block 22B, optional for certain p-type work function materials, method 10 includes converting the p-type work function layer into a second work function layer by conducting an oxygen plasma treatment of the device. At block 24A or 24B, method 10 includes forming a metal fill layer over the work function layer (or the capping layer if present). At block 26, method 10 includes performing a chemical mechanical polishing (CMP) on the device. Additional steps can be provided before, during, and after method 10, and some of the steps described can be moved, replaced, or eliminated for additional embodiments of method 10. Method 10 can continue to complete fabrication of the IC device. For example, a multi-layer interconnect structure can be fabricated for facilitating operation of the IC device.

Figure 2A:
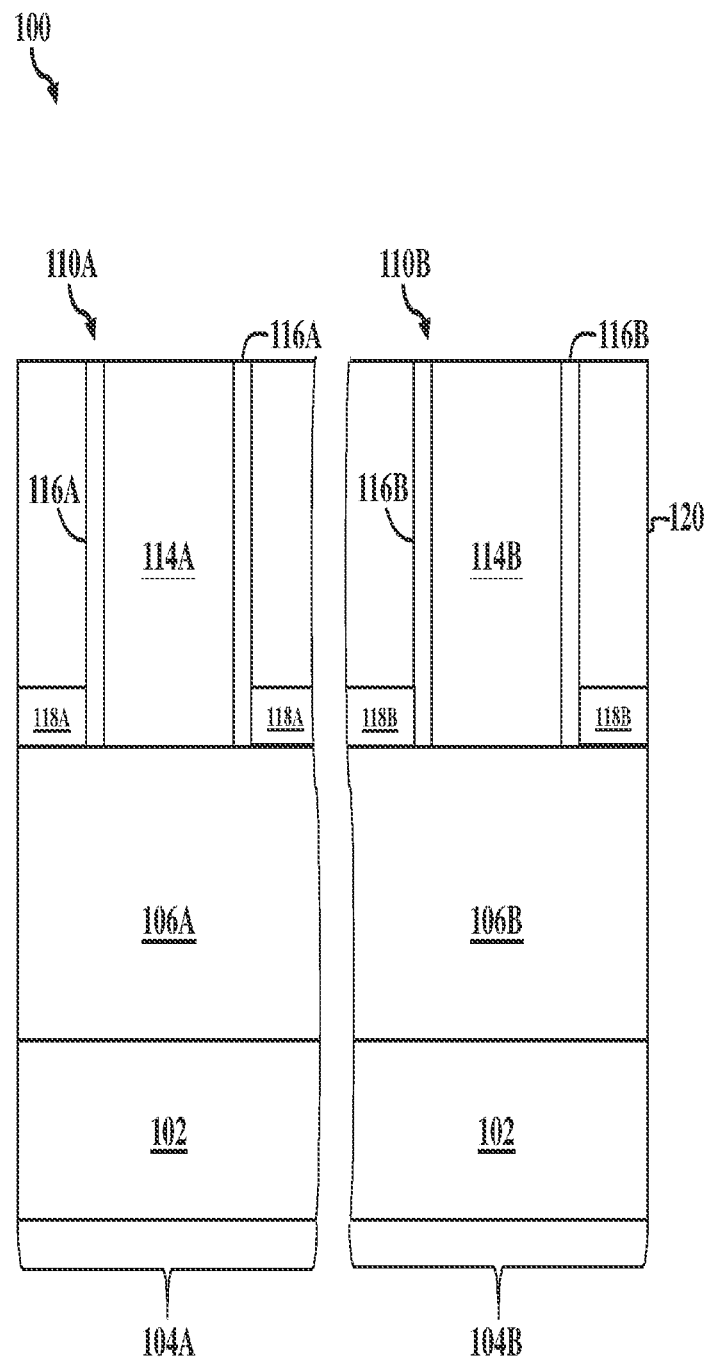
FIGS. 2A-2N are fragmentary diagrammatic views of an IC device, in portion or entirety, at various fabrication stages, such as those associated with the method of FIG. 1, according to various aspects of the present disclosure.
Figure 2B:
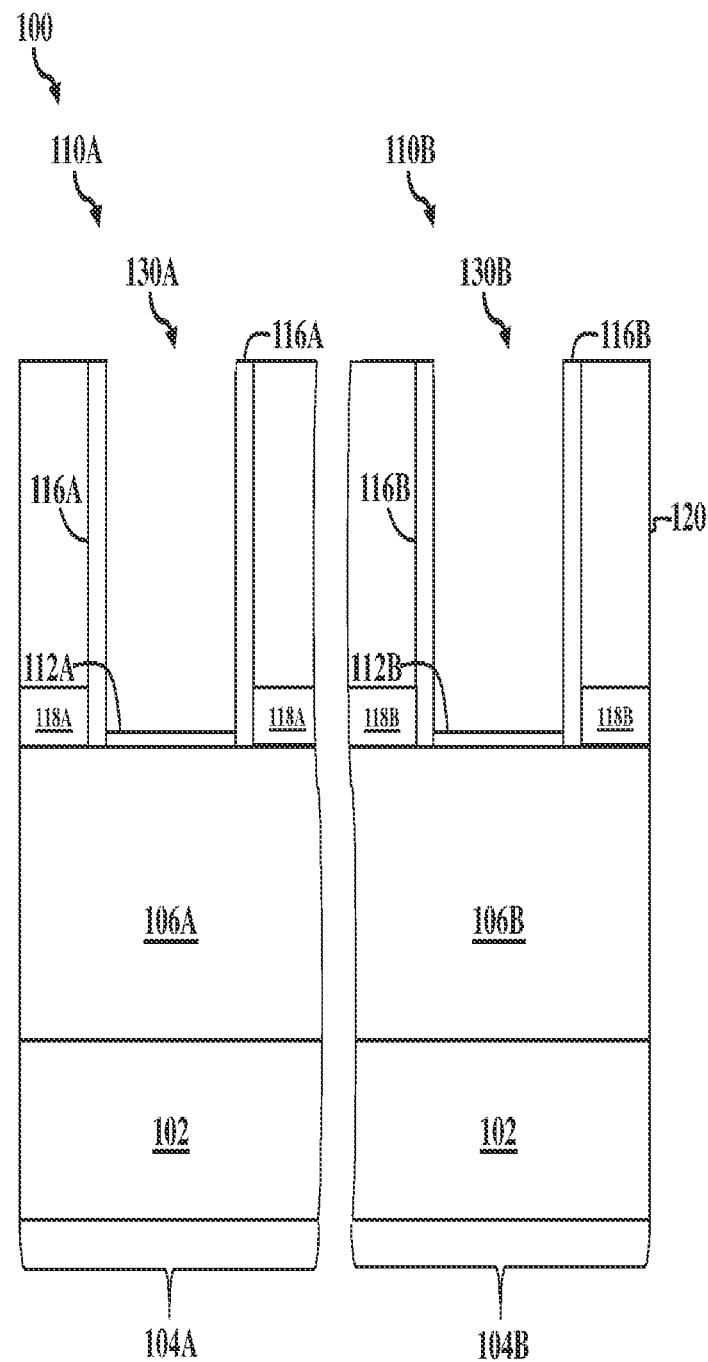
Figure 2C:
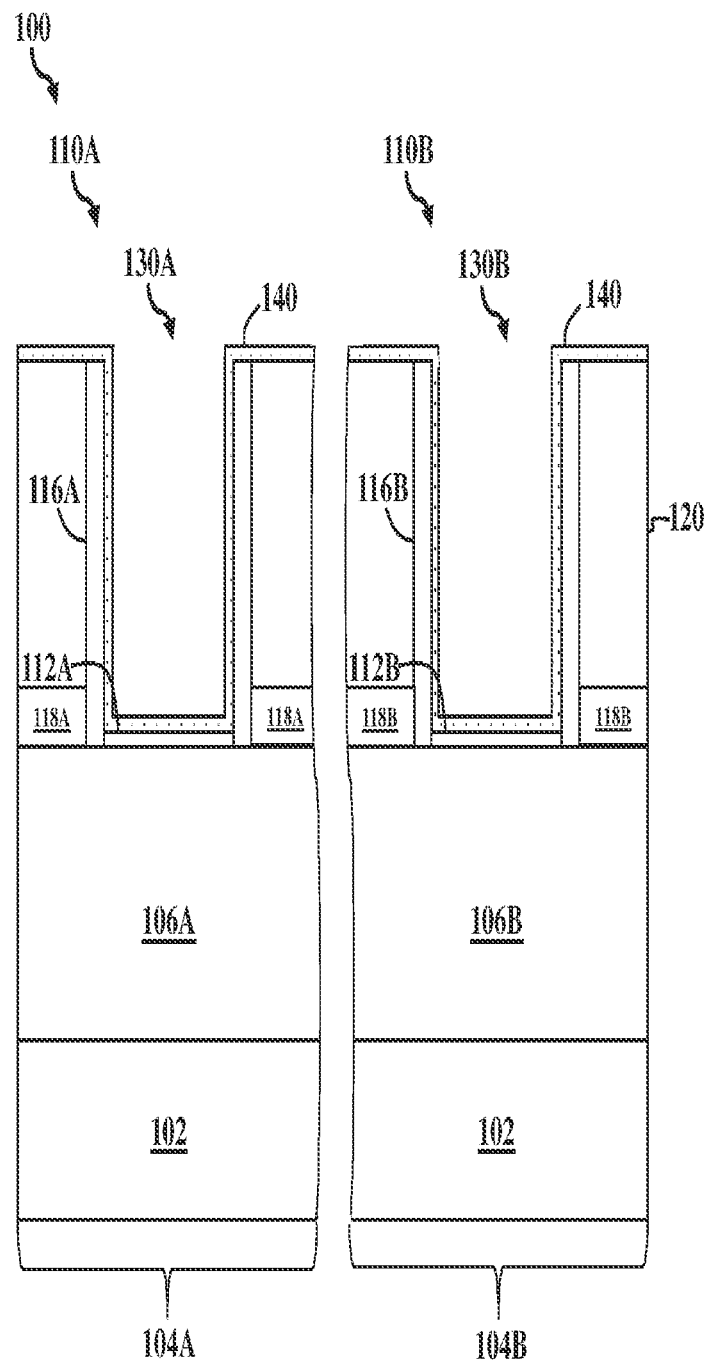
Figure 2D:
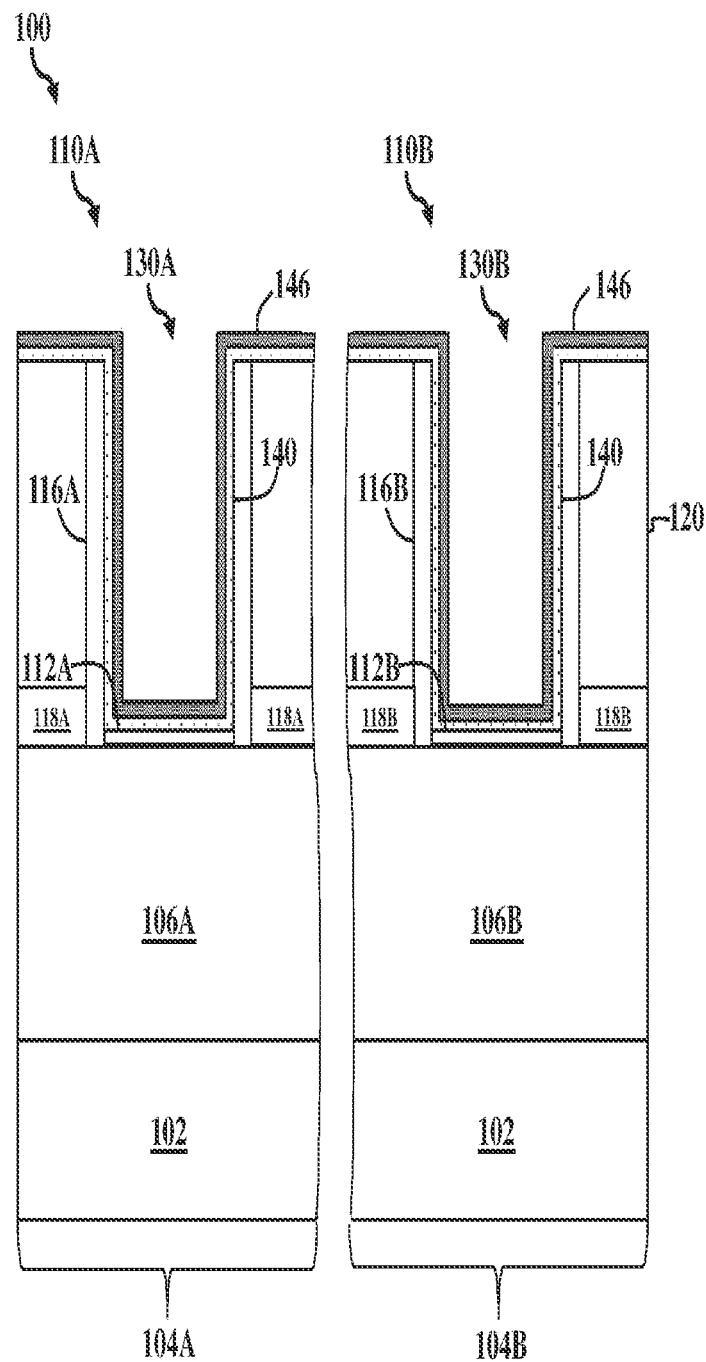
Figure 2E:
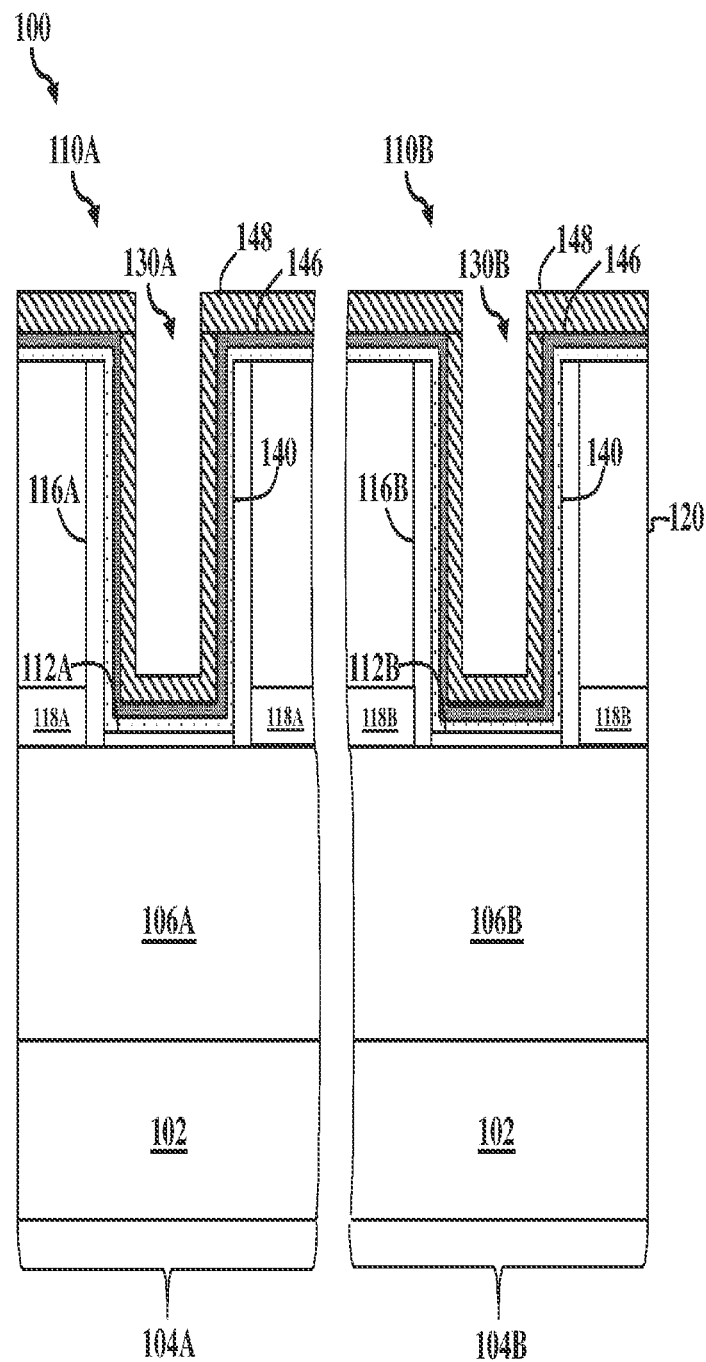
Figure 2F:
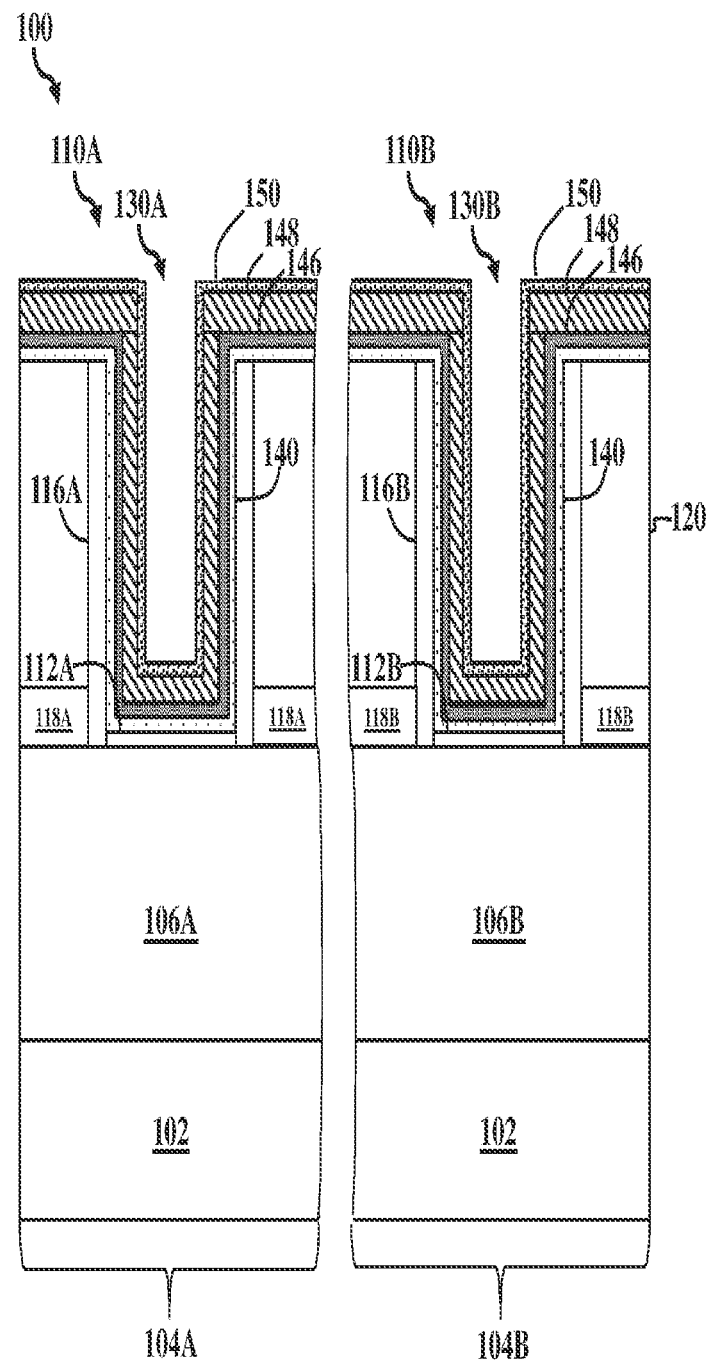
Figure 2G:
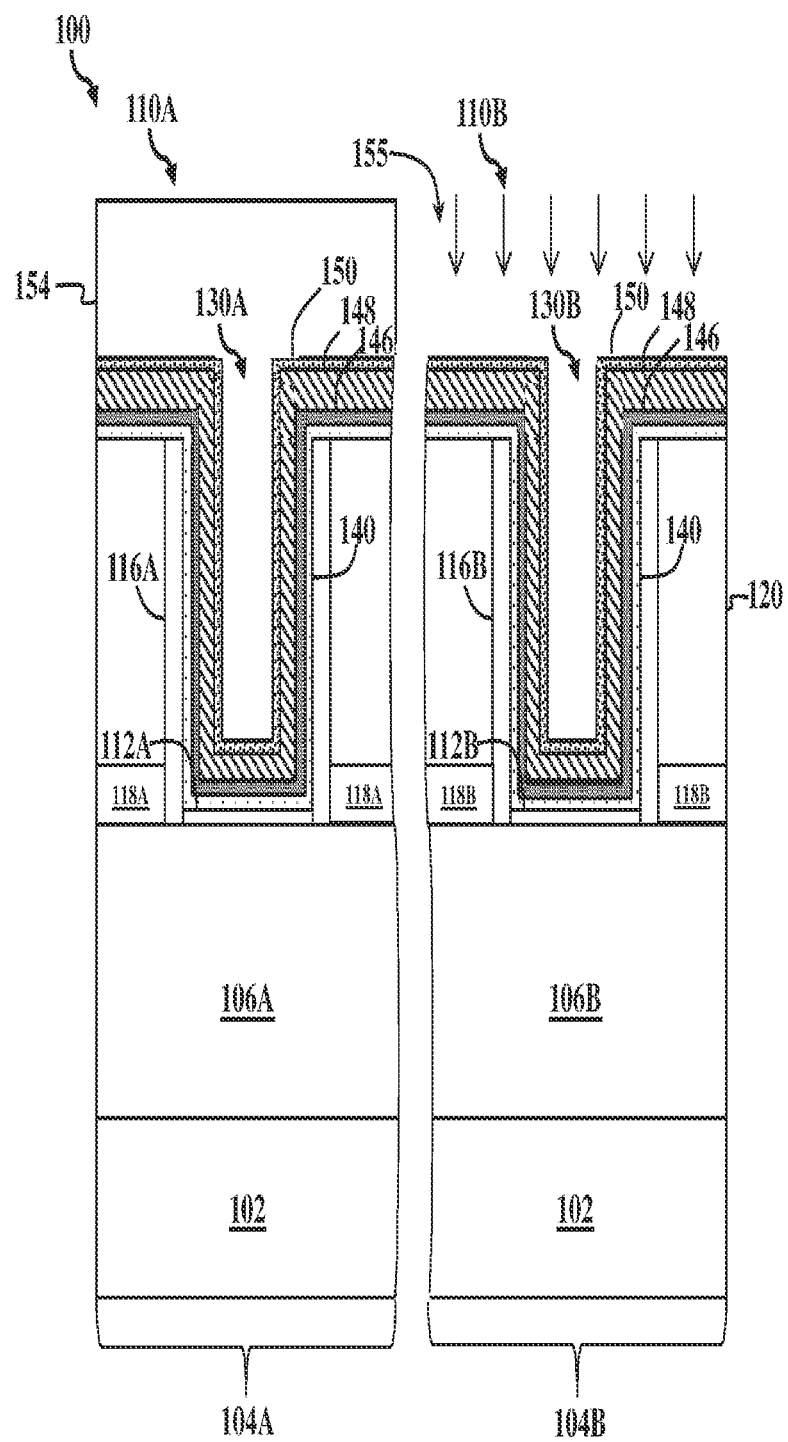
Figure 2H:
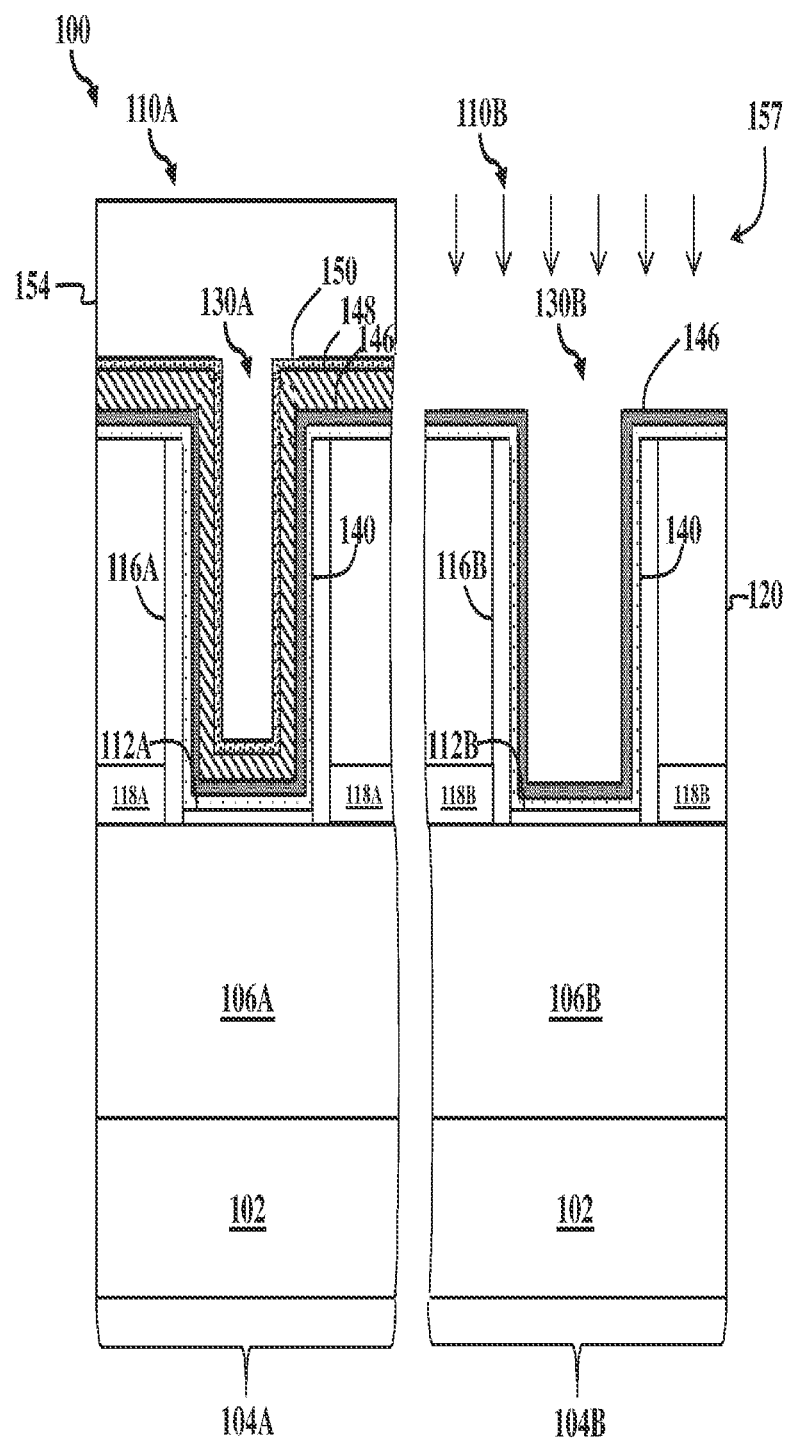
Figure 2I:
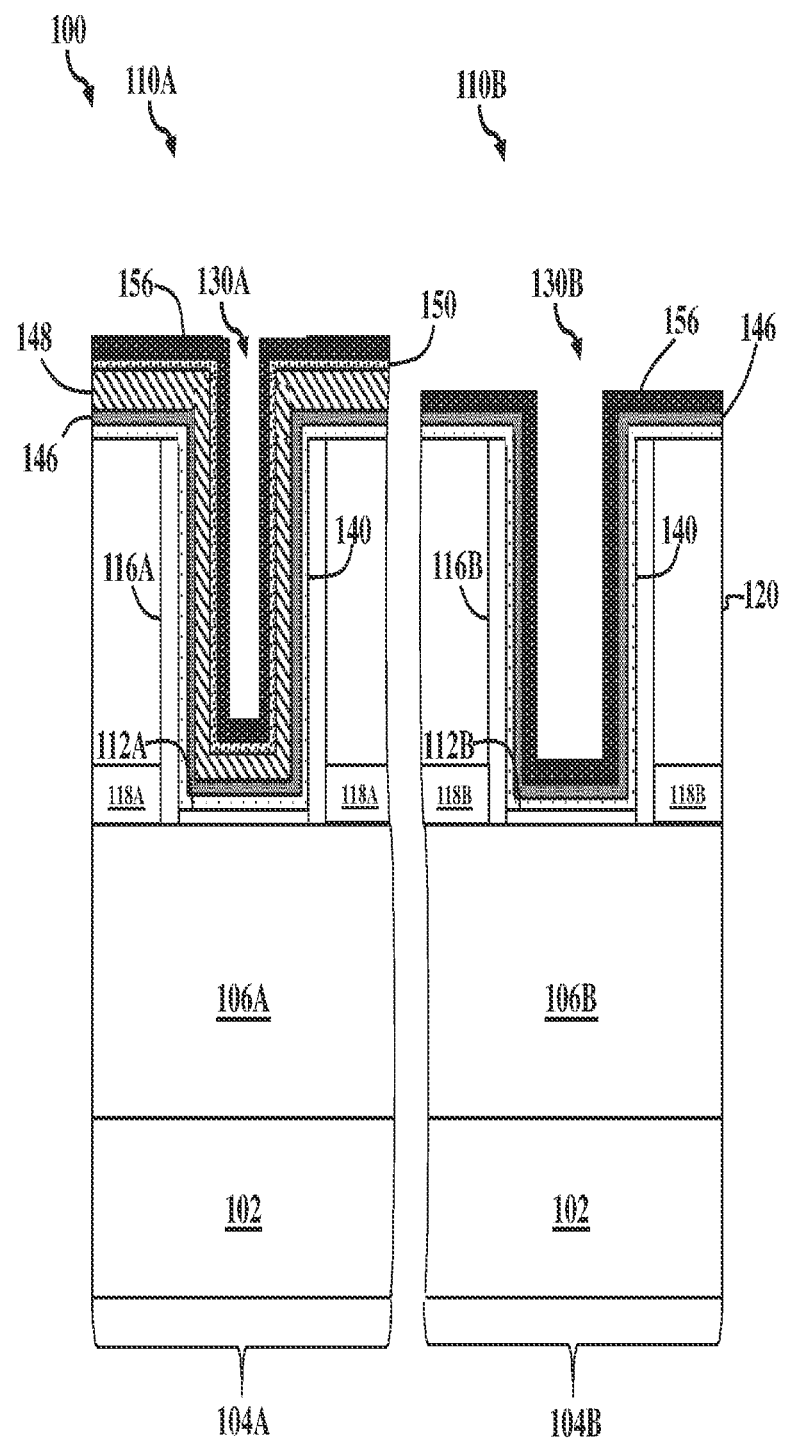
Figure 2J:
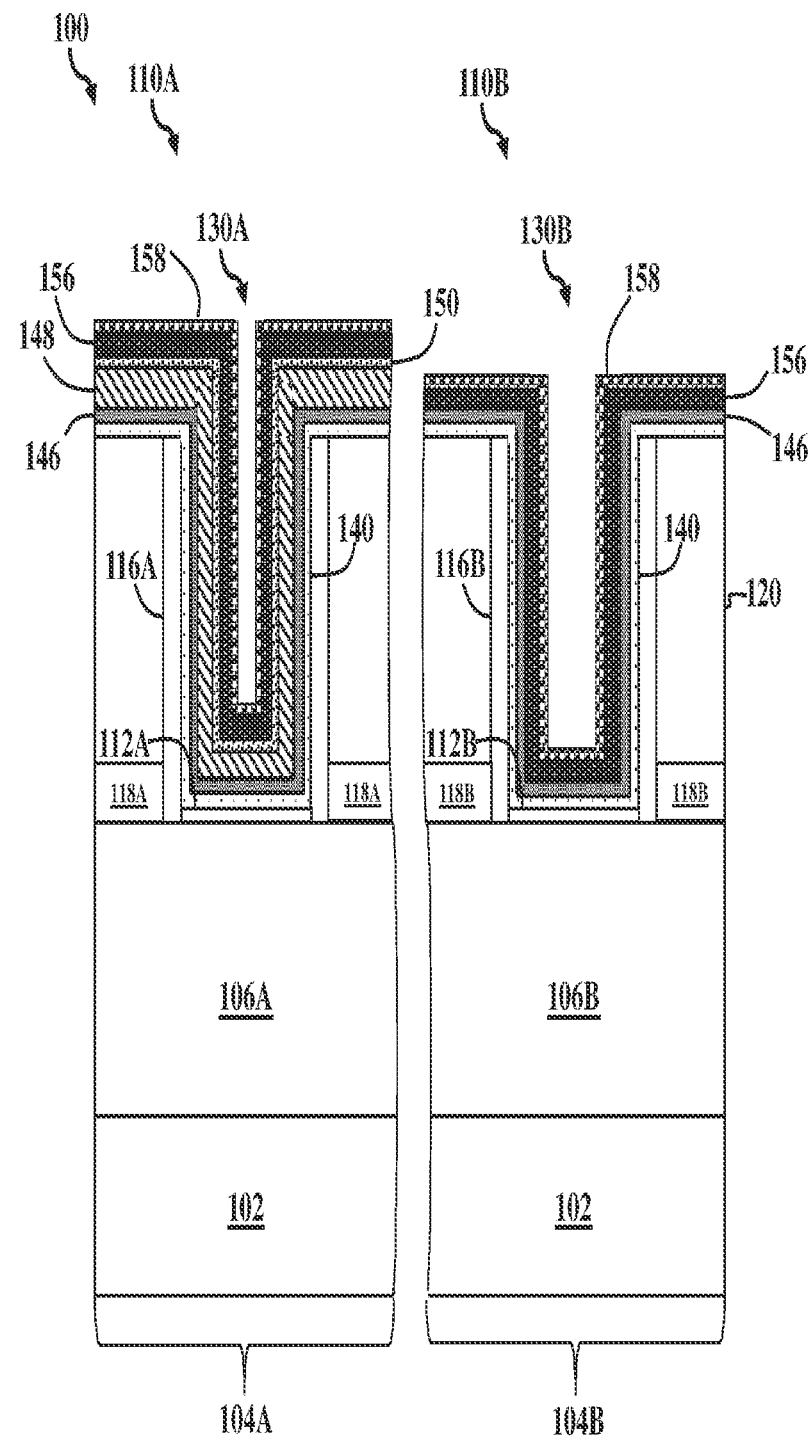
Figure 2K:
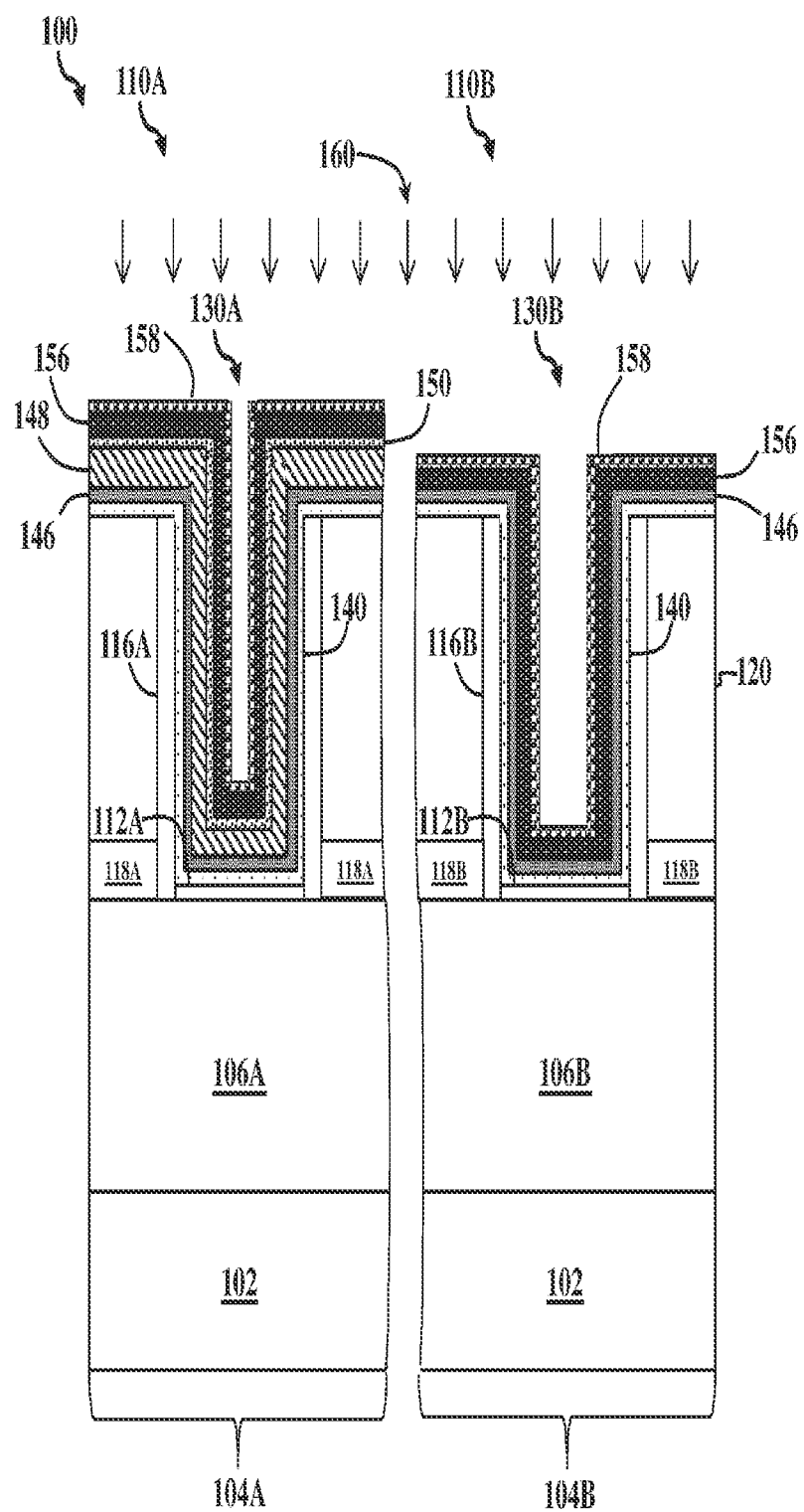
Figure 2L:
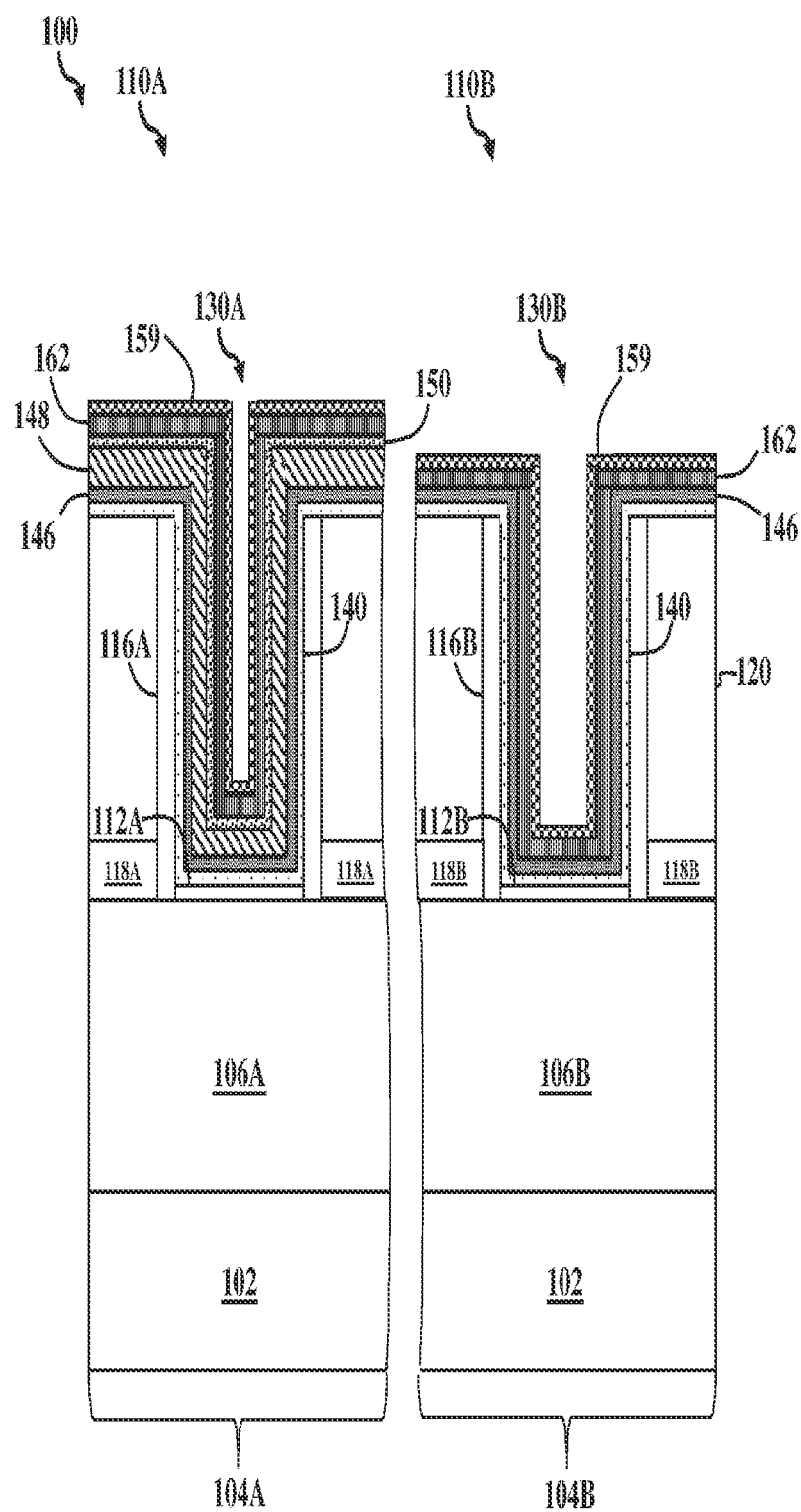
Figure 2M:
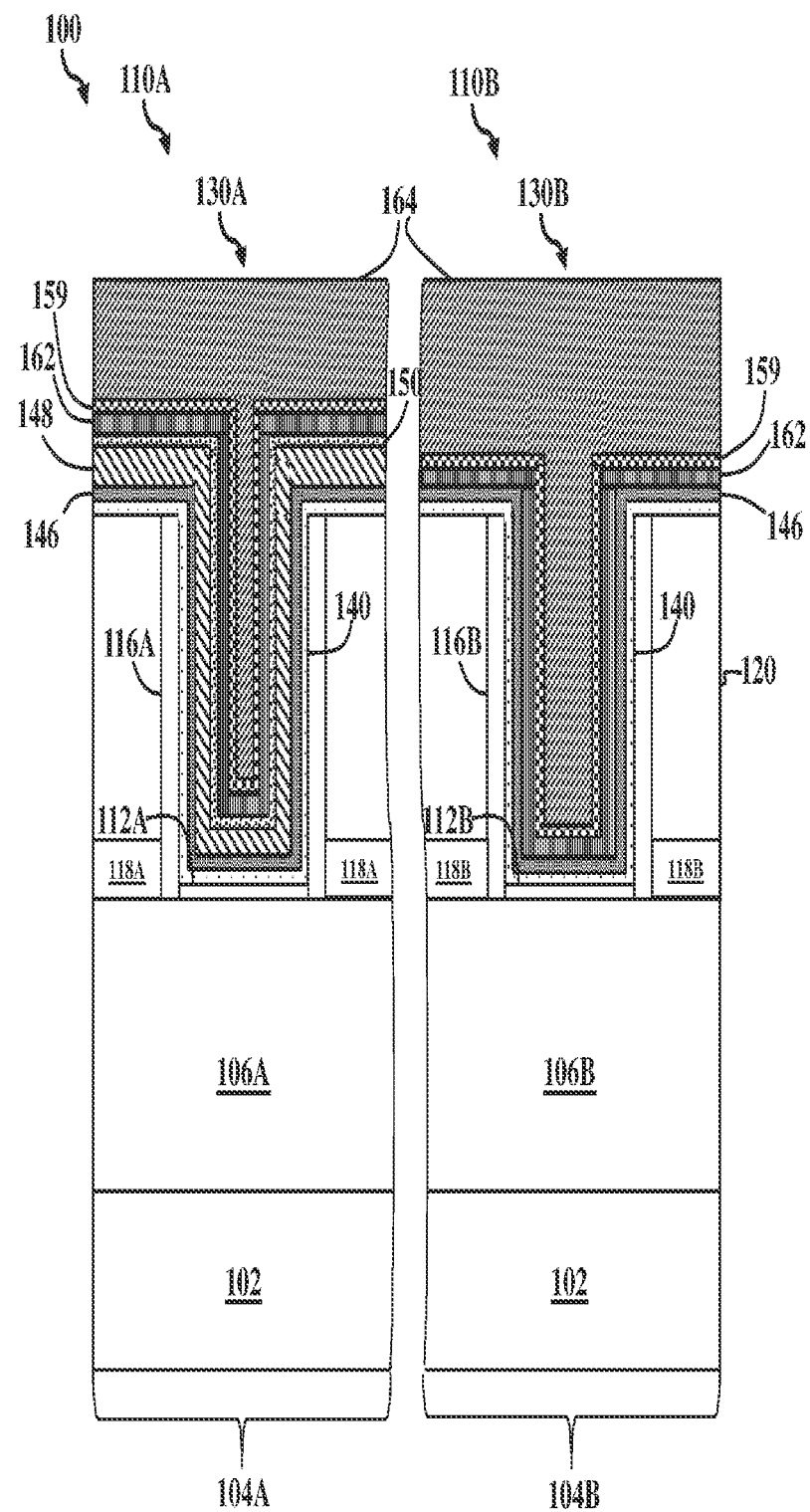
Figure 2N:
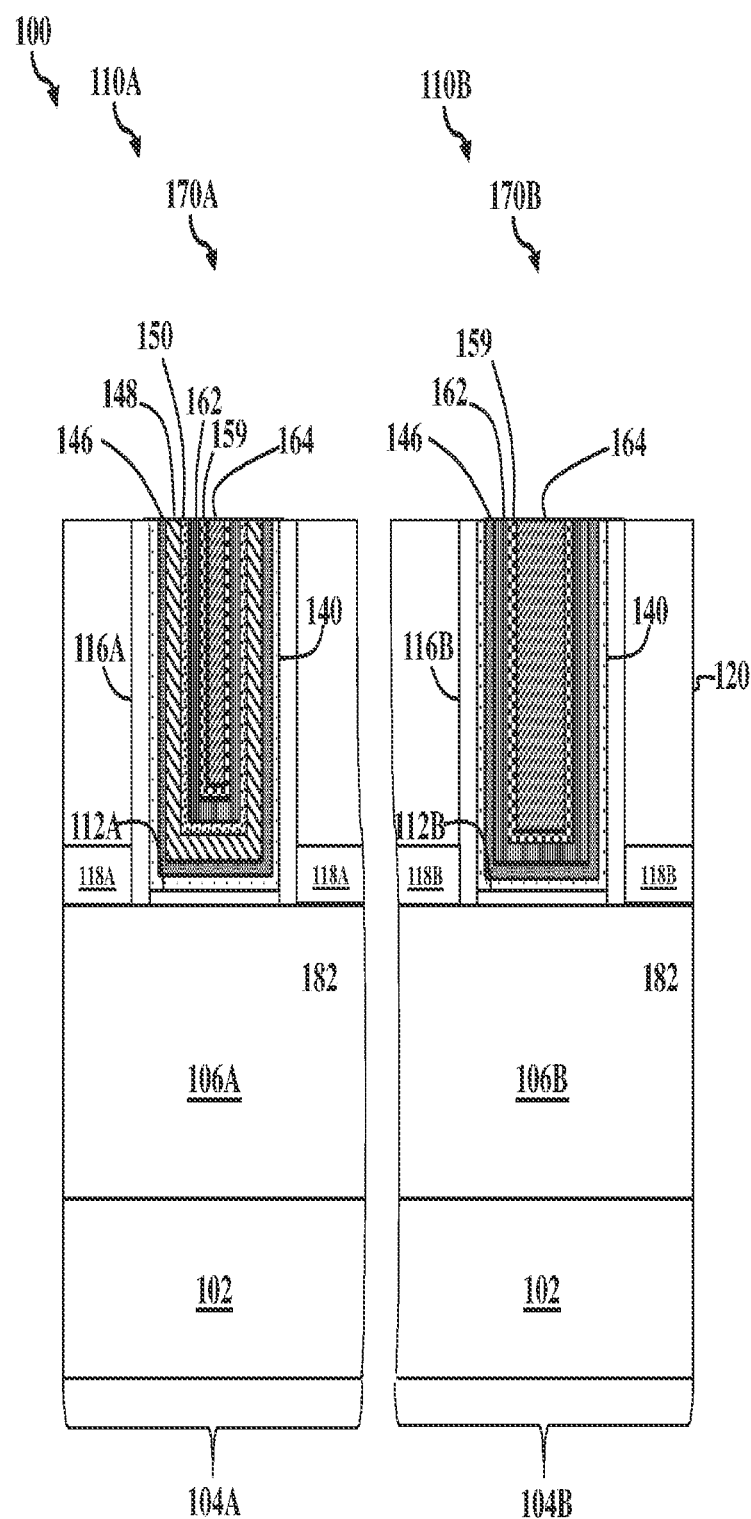

FIGS. 2A-2N are diagrammatic fragmentary cross-sectional side views of a fin-based IC device 100 (or "device 100"), in portion or entirety, at various fabrication stages (such as those associated with method 10 in FIG. 1) according to various aspects of the present disclosure. Fin-based IC device 100 may include planar transistors or multi-gate transistors, such as FinFETs, depending on design requirements. FIGS. 2A-2N have been simplified for the sake of clarity to better understand the inventive concepts of the present disclosure. Additional features can be added in fin-based IC device 100, and some of the features described below can be replaced, modified, or eliminated in other embodiments of fin-based IC device 100.

Turning to FIG. 2A, fin-based IC device 100 includes a substrate (e.g. a wafer) 102. In the depicted embodiment, substrate 102 is a semiconductor substrate, including, for example, silicon. Alternatively, or additionally, substrate 102 includes another elementary semiconductor, such as germanium, a compound semiconductor, an alloy semiconductor, or combinations thereof. Alternatively, substrate 102 is a semiconductor-on-insulator substrate. Various regions are defined for substrate 102, such as an n-type region 104A and a p-type region 104B. These n-type and p-type regions may each include one or more FinFETs configured as transistors. In some implementations, the n-type region and/or the p-type region may or may not be contiguous, and any number of devices and/or device features (for example, isolation features, dummy features, and/or other device features) may be formed between the n-type region and the p-type region depending on design requirements of fin-based IC device 100.

Each region includes transistors with a threshold voltage (Vt). In some implementations, n-type transistors have a threshold of about 0.10 V to about 0.25 V, and p-type transistors have a threshold voltage of about 0.11 V to about 0.26 V. The transistors can also have different threshold voltages (operating voltages) than those explicitly described herein depending on design requirements of fin-based IC device 100. In some implementations, the transistors may include logic transistors, core transistors, SRAM transistors, input/output (I/O) transistors, or other devices that operate using a substantially nominal voltage. In some implementations, the transistors include I/O transistors that convert a higher threshold, input voltage (for example, a power supply voltage) to a lower threshold voltage suitable for low-voltage applications, such as core transistors.

The n-type region and the p-type region each includes at least one fin structure, such as fin structure 106A and fin structure 106B, respectively. Though not evident in the depicted view, fin structure 106A and/or fin structure 106B can include more than one fin depending on design requirements of their respective FinFET device. In some implementations, fin structures 106A and 106B are a portion of substrate 102 (such as a portion of a material layer of substrate 102). Alternatively, in some implementations, fin structures 106A and 106B are defined in a material layer, such as one or more semiconductor material layers overlying substrate 102. For example, fin structures 106A and 106B can include a semiconductor layer stack having various semiconductor layers (such as a heterostructure) disposed over substrate 102. The semiconductor layers can include any suitable semiconductor materials.

The semiconductor layers can include the same or different materials, etching rates, constituent atomic percentages, constituent weight percentages, thicknesses, and/or configurations depending on design requirements of fin-based IC device 100. In some implementations, the semiconductor layer stack includes alternating semiconductor layers, such as semiconductor layers composed of a first material and semiconductor layers composed of a second material. For example, the semiconductor layer stack alternates silicon layers and silicon germanium layers (for example, SiGe/Si/SiGe/Si/SiGe/Si from bottom to top). In some implementations, the semiconductor layer stack includes semiconductor layers of the same material but with alternating constituent atomic percentages, such as semiconductor layers having a constituent of a first atomic percent and semiconductor layers having the constituent of a second atomic percent.

Alternatively, or additionally, in some implementations, fin structure 106A and/or fin structure 106B includes suspended nanostructures (e.g., nanowires or nanosheets). For example, after a semiconductor layer stack with alternating layers is formed (as described above), one of the types of the layers is removed to create suspended nanostructures (e.g., nanowires or nanosheets) on one or both fins (for example, Si nanosheets on fin structure 106A and/or 106B). Fin structure 106A and/or fin structure 106B includes the same or different materials depending on design requirements of their respective FinFET device.

Fin structures 106A and 106B are formed over substrate 102 using any suitable process. In some implementations, a combination of deposition, lithography and/or etching processes are performed to define fin structures 106A and 106B extending from substrate 102 as illustrated in FIG. 2A. Alternatively, fin structures 106A and 106B are formed by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. In some implementations, directed self-assembly (DSA) techniques are implemented while forming fin structures 106A and 106B. Further, in some implementations, the exposure process can implement maskless lithography, electron-beam (e-beam) writing, ion-beam writing and/or nanoprint technology for patterning the resist layer.

Isolation feature(s) are formed over and/or in substrate 102 to isolate various regions and/or features of fin-based IC device 100. For example, isolation features define and electrically isolate the n-type region and the p-type region from each other, fin structures 106A and 106B from each other, and/or fins of fin structures 106A and 106B from each other. Isolation features include silicon oxide, silicon nitride, silicon oxynitride, other suitable isolation material (for example, including silicon, oxygen, nitrogen, carbon, or other suitable isolation constituent), or combinations thereof. Isolation features can include different structures, such as shallow trench isolation (STI) structures, deep trench isolation (DTI) structures, and/or local oxidation of silicon (LOCOS) structures.

Various gate structures are disposed over fin structures 106A and 106B, such as a gate structure 110A disposed over fin structure 106A, and a gate structure 110B disposed over fin structure 106B. Though not evident in the depicted view, gate structures 110A and 110B wrap a portion of fin structures 106A and 106B, respectively, such that gate structures 110A and 110B interpose a source region and a drain region (collectively referred to as source/drain regions) of fin structures 106A and 106B, respectively. Gate structures 110A and 110B engage channel regions defined between the source regions and the drain regions, such that current can flow between the source/drain regions during operation. In the depicted embodiment, gate structures 110A and 110B include gate stacks configured for a gate last process. For example, gate structures 110A and 110B respectively include dummy gate layers 114A and 114B (including, for example, polysilicon). Dummy gate layers 114A and 114B can include a multi-layer structure. For example, in some implementations, dummy gate layers 114A and 114B include a dummy gate dielectric layer and a dummy gate electrode layer. In many embodiments, gate structures 110A and 110B further include interfacial layers between the fin structures 106A and 106B and the dummy gate layers 114A and 114B.

Gate structures 110A and 110B are formed by deposition processes, lithography processes, etching processes, other suitable processes, or combinations thereof. Gate structures 110A and 110B further include spacers 116A and 116B, which are disposed adjacent to (for example, along sidewalls of) the gate stacks (here, dummy gate layers 114A and 114B, respectively). Spacers 116A and 116B are formed by any suitable process and include a dielectric material. In some implementations, spacers 116A and 116B include a multi-layer structure, such as a first dielectric layer that includes silicon nitride and a second dielectric layer that includes silicon oxide. Implantation, diffusion, and/or annealing processes may be performed to form lightly doped source and drain (LDD) features and/or heavily doped source and drain (HDD) features in source/drain regions of fin structures 106A and 106B before and/or after forming spacers 116A and 116B, depending on design requirements of fin-based IC device 100.

Epitaxial source features and epitaxial drain features (referred to as epitaxial source/drain features 118A and 118B) may be disposed in source/drain regions of fin structures 106A and 106B such that the gate structures 110A and 110B respectively interpose epitaxial source/drain features 118A and 118B. Epitaxial source/drain features 118A and 118B are doped with n-type dopants or p-type dopants depending on whether the devices are configured as n-type devices or p-type devices. In the depicted embodiment, the n-type region 104A is configured with n-type FinFETs. Epitaxial source/drain features 118A, therefore, includes silicon and/or carbon, and are doped with phosphorous, arsenic, or other n-type dopant. Similarly, the p-type region 104B is configured with p-type FinFETs. Epitaxial source/drain features 118B, therefore, includes silicon and/or germanium, and are doped with boron, boron fluoride, or other p-type dopant. The epitaxial source/drain features 118A and 118B may include the same or different materials and may include the same or different dopants. In some implementations, the fin structures 106A and 106B are recessed, such that epitaxial source/drain features 118A and 118B are grown from recessed portions of fin structures 106A and 106B.

An interlevel dielectric (ILD) layer 120 is disposed over substrate 102, and includes a dielectric material such as silicon oxide, silicon nitride, silicon oxynitride, TEOS formed oxide, PSG, BPSG, low-k dielectric material, other suitable dielectric material, or combinations thereof. In some implementations, a contact etch stop layer (CESL) is disposed between ILD layer 120 and fin structures 106A and 106B and/or gate structures 110A and 110B. The CESL includes a material different than ILD layer 120, such as a dielectric material that is different than the dielectric material of ILD layer 120. A CMP process and/or other planarization process may be performed to expose a top portion of gate structures 110A and 110B. In the depicted embodiment, top surfaces of dummy gate layers 114A and 114B are substantially planar with a top surface of ILD layer 120.

Turning to FIGS. 2B-2N, a gate replacement process is performed, where dummy gate stacks of gate structures 110A and 110B are replaced with metal gate stacks. During processing, one or more of the gate layers of gate structures 110A and 110B may be altered when exposed to external ambient as fin-based IC device 100 is transferred between processing systems for processing. For example, surfaces of one or more of the gate layers of gate structures 110A and 110B may be oxidized when exposed to oxygen in ambient air, undesirably altering the threshold voltages corresponding with gate structures 110A and 110B. To minimize such occurrences, in some implementations, one or more of the gate layers of gate structures 110A and 110B can be processed "in-situ," which may refer to performing various processes on fin-based IC device 100 within the same IC processing system or IC processing tool, allowing fin-based IC device 100 to remain under vacuum conditions during the various processes. In some embodiments, "in-situ" may also refer to performing various processes on fin-based IC device 100 without exposing fin-based IC device 100 to an external ambient (for example, external to an IC processing system), such as atmospheric oxygen.

Turning to FIG. 2B, an etching process selectively removes dummy gate layers 114A and 114B of gate structures 110A and 110B, thereby forming an opening 130A in gate structure 110A and an opening 130B in gate structure 110B. Interfacial layers 112A and 112B are formed over the fin structures 106A and 106B in the openings 130A and 130B, respectively. In the depicted embodiment, openings 130A and 130B (also referred to as gate trenches) have sidewall surfaces defined respectively by spacers 116A and 116B and bottom surfaces respectively defined by interfacial layers formed on the fin structures 106A and 106B. The etching process may be a dry etching process, a wet etching process, or combinations thereof. The etching process can be tuned, such that dummy gate layers 114A and 114B are removed without (or minimally) etching other features of fin-based IC device 100, such as ILD layer 120, spacers 116A and 116B, interfacial layers (if present), and/or fin structures 106A and 106B.

Turning to FIG. 2C, a gate dielectric layer 140 is formed over the interfacial layers 112A and 112B. The gate dielectric layer 140 includes a dielectric material, such as silicon oxide or other suitable dielectric material. The gate dielectric layer 140 may be formed by any suitable methods, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), spin coating, plating, other deposition process, or combinations thereof. For example, a gate dielectric layer 140 may be conformally deposited over the interfacial layers 112A and 112B by an ALD process, such that gate dielectric layer 140 has a substantially uniform thickness and partially fills openings 130A and 130B. In the depicted embodiment, gate dielectric layer 140 is disposed on sidewall surfaces and bottom surfaces that define openings 130A and 130B, such that gate dielectric layer 140 is disposed on the upper surfaces of the interfacial layers 112A and 112B, on the sidewall and upper surfaces of the spacers 116A and 116B, as well as on the upper surfaces of the ILD layer 120.

In the depicted embodiment, gate dielectric layer 140 includes a high-k dielectric material (and thus may be referred to as a high-k dielectric layer 140), such as hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). In some embodiments, the gate dielectric layer 140 is subject to additional treatment process to improve its quality. For example, a capping layer (not shown) may be formed over the gate dielectric layer 140, and an annealing process is conducted through the capping layer. As a result of the treatment, the gate dielectric layer 140 may have a better quality. Such treatment processes may be repeated with different capping layers, different reactive environment, and at different temperatures. The capping layer is subsequently removed to expose the gate dielectric layer 140 for further processing. In many embodiments, the gate dielectric layer 140 has a thickness of about 10 Å to about 20 Å.

Turning to FIG. 2D, a layer 146 is formed over the exposed gate dielectric layer 140 such that it has a substantially uniform thickness and partially fills openings 130A and 130B. Exemplary materials for the layer 146 include titanium nitride (TiN), tantalum nitride (TaN), tungsten nitride (WN), tungsten carbonitride (WCN), titanium silicon nitride (TiSiN), and/or tantalum silicon nitride (TaSiN). Any suitable depositions may be used, such as ALD, CVD, PVD, HDPCVD, MOCVD, RPCVD, PECVD, LPCVD, ALCVD, APCVD, spin coating, plating, other deposition process, or combinations thereof. The processing parameters may be tuned to achieve the layer 146 with a desired thickness. Additionally, one or more etching back steps may be used to fine-tune the thickness of the layer 146. In some implementations, the layer 146 has a thickness of about 1 Å to about 3 Å. In some embodiments, the etching back treatments also optimize the surface of the layer 146 for subsequent processing. For example, the etching back treatments may remove the native oxides spontaneously formed on the surface.

Turning to FIGS. 2E-2H, processing continues to form an n-type work function layer 148 in the opening 130A over the layer 146 in the n-type region of the device. N-type work function materials include Ti, Al, Ag, Mn, Zr, TiAl, TiAlC, TaC, TaCN, TaSiN, TaAl, TaAlC, TiAlN, other n-type work function material, or combinations thereof. In one implementation, an n-type work function layer 148 is first formed over both the n-type region and the p-type region of the device, and is later removed from the p-type region following a photolithography patterning process. Alternatively, photolithography may be conducted first to form appropriate patterns, such that the n-type work function layer is only formed in the n-type region of the device, and not the p-type region of the device.

In the depicted embodiment, turning to FIG. 2E, an n-type work function layer 148 is formed over the layer 146 over both the n-type region and the p-type region. The n-type work function layer 148 may be formed by any suitable deposition process, such as ALD, CVD, PVD, HDPCVD, MOCVD, RPCVD, PECVD, LPCVD, ALCVD, APCVD, spin coating, plating, other deposition process, or combinations thereof. In one implementation, the layer 148 may be conformally deposited in-situ over the layer 146, such that the n-type work function layer 148 has a substantially uniform thickness and partially fills opening 130A and opening 130B. The layer 148 may have a thickness of about 10 Å to about 20 Å.

Turning to FIG. 2F, a layer 150 is deposited in-situ over the n-type work function layer 148 to, for example, provide protection against oxidative degradations. In some implementations, the layer 150 is one single layer with a uniform material. Exemplary materials for the layer 150 include TiN, TaN, WN, WCN, TiSiN, and/or TaSiN. In some other implementations, the layer 150 includes more than one sub-layers, each including different materials. For example (not shown), the layer 150 includes one sub-layer comprising TiN, TaN, WN, WCN, TiSiN, and/or TaSiN, and another sub-layer comprising aluminum oxide ($Al_2O_3$), silicon oxide ($SiO_2$), and/or germanium oxide ($GeO_2$). The layer 150 may have a thickness of about 5 Å to about 15 Å. The combination of two sub-layers, in some circumstances, provides superior protection to the underlying n-type work function layer 148 from being oxidized than either sub-layer alone at the same total thickness. The layer 150 (or the sub-layers) may be formed by any appropriate methods. For example, the layer 150 may be conformally deposited over the n-type work function layer 148 by an ALD process. Alternatively, the layer 150 may be formed using another suitable deposition process, such as CVD, PVD, HDPCVD, MOCVD, RPCVD, PECVD, LPCVD, ALCVD, APCVD, spin coating, plating, other deposition process, or combinations thereof.

Processing continues to conduct photolithography to form appropriate patterns. Turning to FIG. 2G, a patterned masking layer 154 is formed over device 100. Patterned masking layer 154 covers the n-type region 104A and has one or more openings 155 that expose the p-type region 104B. Patterned masking layer 154 is formed by any suitable process, including the deposition processes, lithography processes, and/or etching process described herein. In some implementations, patterned masking layer 154 includes a material having a different etching characteristics from those of the layer 150 (or the sub-layers), and the n-type work function layer 148. In some implementations, patterned masking layer 154 includes a resist material, and thus may be referred to as a patterned resist layer and/or a patterned photoresist layer. In other implementations, other suitable materials may be employed instead. Any suitable process is then used to remove the layer 150 (or the sub-layers) and the n-type work function layer 148 from the p-type region, thereby exposing the layer 146 in p-type device region 104B as depicted. Thereafter, patterned masking layer 154 is removed. The resulting structure is shown in FIG. 2H.

Processing continues to form a p-type work function layer. P-type work function materials include TiN, TaN, Ru, Ir, Mo, Al, $RuO_2$, $IrO_2$, WN, $ZrSi_2$, $MoSi_2$, $TaSi_2$, $NiSi_2$, WN, other p-type work function material, or combinations thereof. In one embodiment, an in-situ pre-deposition cleaning process is conducted to prepare the surface of the device for a subsequent deposition of the p-type work function layer. In one implementation, the layer 146 now exposed in the p-type region is subject to etching back 157. Therefore, although not evident from the figures, the thickness of the layer 146 in FIG. 2I is smaller than that in FIG. 2H. The etching back 157 may be performed by exposing the layer 146 in the p-type region to a chlorine-containing metal compound, such as tantalum pentachloride ($TaCl_5$). The processing temperature may be at about 300° C. to about 500° C. The processing pressure may be at about 5 torr to about 15 torr. Alternatively, tungsten pentachloride ($WCl_5$) is used instead at similar conditions. As a result, the layer 146 is exposed in the p-type region with a fresh surface free from oxides or other contaminants. Various etching parameters can be tuned to achieve desired properties. Such parameters include etchant composition, etching temperature, etching solution concentration, etching time, etching pressure, source power, RF bias voltage, RF bias power, etchant flow rate, or combinations thereof.

Turning to FIG. 2I, a p-type work function layer 156 is formed in-situ over both the n-type region and the p-type region. For example, a p-type work function layer 156 is conformally deposited in-situ over both the n-type region and the p-type region by ALD, such that p-type work function layer 156 has a substantially uniform thickness and partially fills openings 130A and 130B. In some implementations, p-type work function layer 156 has a step coverage of more than 99% of the surface. In the depicted embodiment, a p-type work function layer 156 is formed over the layer 150 in the n-type device region, and over the layer 146 in the p-type region. The as-formed p-type region is substantially free from any n-type material. In conventional technologies, n-type materials are present in the p-type region. Therefore, diffusions of such n-type materials into the p-type work function layer may cause the work function to shift to the mid-gap, thereby undesirably increasing the threshold voltage. The present method avoids such a complication.

In one embodiment, the p-type work function layer 156 includes suitable metal-based p-type work function materials, such as Ru and/or Ir. As compared to other p-type work function materials, for example, TiN, these materials may reach the required high work function at a relatively small thickness. The number of the ALD cycles may be controlled to form the p-type work function layer 156 with a desired thickness, for example, by adjusting the process time. In one implementation, a thickness of p-type work function layer 156 is about 10 Å to about 15 Å with a uniformity of less than about 1% to about 3%. In one implementation, a Ru film is formed by ALD with triruthenium dodecacarbonyl ($Ru_3(CO)_{12}$) and hydrogen ($H_2$) as precursors. In some implementations, the ALD process is performed at a temperature of about 100° C. to about 200° C. and at a total pressure of about 5 torr to about 15 torr. Alternatively, p-type work function layer 156 is formed in-situ using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIG. 2J, in one embodiment, the processing further optionally includes forming a capping layer 158 in-situ over the p-type work function layer 156. For example, a capping layer 158 is conformally deposited the over the p-type work function layer 156 by an ALD process, such that the capping layer 158 has a substantially uniform thickness and partially fills openings 130A and 130B. Exemplary materials for the capping layer 158 include TiN, TaN, WN, WCN, TiSiN, and/or TaSiN. In the depicted embodiment, the capping layer 158 includes TaN. In such implementations, the ALD process can implement a tantalum-containing precursor and a nitrogen-containing precursor. For example, the tantalum-containing precursor may be pentakis(dimethylamino) tantalum (PDMAT), the nitrogen-containing precursor may be ammonia ($NH_3$), and the ALD process may be performed at a temperature of about 225° C. to about 275° C. The number of the ALD cycles may be controlled to form the capping layer 158 with a desired thickness, for example, by adjusting the process time. In some implementations, the capping layer 158 has a thickness of about 5 Å to about 15 Å. Further, alternatively, the capping layer 158 may be formed using another suitable deposition process, such as CVD, PVD, HDPCVD, MOCVD, RPCVD, PECVD, LPCVD, ALCVD, APCVD, spin coating, plating, other deposition process, or combinations thereof.

Turning to FIG. 2K, processing continues to conduct an optional ex-situ oxygen plasma treatment 160 of the surface of the device 100. In many embodiments, this process converts at least a top portion of the p-type work function layer 156 from a metal-based conductor into a metal oxide-based conductor. As described above, the capping layer 158 overlays the p-type work function layer 156. Therefore, the ex-situ oxygen plasma treatment 160 is conducted through the capping layer 158. In the depicted implementation, a ruthenium (Ru) film is used as the p-type work function layer material. Therefore, turning to FIG. 2L, the ex-situ oxygen plasma treatment 160 converts at least a portion of the ruthenium (Ru) film into a ruthenium oxide ($RuO_2$) film. In another implementation, an iridium (Ir) film is used as the p-type work function layer material, and the ex-situ oxygen plasma treatment 160 converts at least a portion of the iridium (Ir) into an iridium oxide ($IrO_2$) film. In some implementations, the entire p-type work function layer material (such as Ru, Ir) is converted into its corresponding metal oxide. In some other implementations, a portion of the p-type work function material remains as metal-based. The degree of oxidation may be tuned by adjusting the dose of the oxygen in the ex-situ oxygen plasma treatment 160.

Without being limited by theory, converting the p-type work function layer into its corresponding metal oxides increases the work function of the work function layer, such that it approaches the band edge of the transistor channel semiconductor. For example, by converting Ru into $RuO_2$, the work function increases from about 4.9 eV to about 5.1 eV. As a result, the threshold voltage of the device 100 is further reduced in the embodiments of the present disclosure, as compared to devices that lack the oxygen plasma treatment. Additionally, metal oxide-based p-type work function materials are also less prone to oxidative attacks such as when exposed to atmospheric oxygen environment. Therefore, device reliability and stability increase.

In some embodiments, as illustrated in FIG. 2L, the ex-situ oxygen plasma treatment 160 also converts at least a portion of the capping layer 158 into a capping layer 159. The capping layer 159 may be an oxidized form of the capping layer 158. For example, a capping layer 158 including TaN may be converted into a capping layer 159 which includes tantalum oxide (TaO) and/or tantalum oxynitride (TaON).

As described above, the p-type work function layer 156 is converted into a second p-type work function layer 162 (FIG. 2L). The second p-type work function layer 162 may include only metal oxide, such as $RuO_2$ or $IrO_2$; alternatively, the second p-type work function layer 162 may include both the unoxidized metal and the metal oxide, such as coexisting Ru and $RuO_2$, or coexisting Ir and $IrO_2$. The ratio between the amount of unoxidized metal and the amount of metal oxide affects the threshold voltage of final device. It has been found that a molar ratio Ru:$RuO_2$ smaller than about 0.9 to about 1.1 is needed to realize certain benefits of this embodiment. Therefore, by adjusting the dose of the oxygen plasma treatment, the threshold voltage may be tuned. In one implementation, the oxygen plasma treatment is implemented at a temperature of about 160° C. to about 250° C. with an oxygen flow rate of about 2,000 sccm (standard cubic centimeters per minute) to about 6,000 sccm. In some implementations, the ex-situ oxygen plasma treatment 160, the formation of the capping layer 158, and/or the formation of the capping layer 159 is omitted.

Turning to FIG. 2M, processing continues to fill the openings 130A and 130B with a metal fill (or bulk) layer 164. The metal fill layer 164 includes a suitable conductive material, such as Co, Al, W, and/or Cu, and may be formed by any suitable methods. In some implementations, metal fill layer 164 has a thickness of about 1,500 Å to about 3,000 Å. Metal fill layer 164 may additionally or collectively include other metals, metal oxides, metal nitrides, other suitable materials, or combinations thereof. Alternatively, metal fill layer 164 is formed using another suitable deposition process, such as PVD, HDPCVD, MOCVD, RPCVD, PECVD, LPCVD, ALCVD, APCVD, spin coating, plating, other deposition process, or combinations thereof.

Turning to FIG. 2N, a planarization process is performed to remove excess gate materials from device 100. For example, a CMP process is performed until a top surface of ILD layer 120 is reached (exposed). In the depicted embodiment, top surfaces of gate structures 110A and 110B are substantially planar with a top surface of ILD layer 120 after the CMP process. Accordingly, an n-type FinFET 170A including gate structure 110A is disposed in n-type region 104A, and a p-type FinFET 170B including gate structure 110B is disposed in p-type region 104B. Gate structure 110A includes interfacial layer 112A, a gate dielectric layer 140, a layer 146, an n-type work function layer 148, a layer 150, a p-type work function layer 162 (or p-type work function layer 156, if the oxygen plasma treatment is omitted), a capping layer 159 (or a capping layer 158, if the oxygen plasma treatment is omitted), and a metal fill layer 164. Gate structure 110B includes interfacial layer 112B, a gate dielectric layer 140, a layer 146, a p-type work function layer 162 (or p-type work function layer 156, if the oxygen plasma treatment is omitted), a capping layer 159 (or a capping layer 158, if the oxygen plasma treatment is omitted), and a metal fill layer 164. Importantly, because the gate structure 110B has a p-type work function that is sufficiently high and close to the work function of the channel semiconductor, the threshold voltage of the transistor device, which is largely controlled by the difference in the work functions, becomes very low. Accordingly, the low threshold voltage devices are thus achieved.

As discussed above, the various methods for forming gate stacks and related gate structures disclosed herein may be implemented in any of a variety of device types. For example, aspects of the present disclosure may be implemented to form gate stacks suitable for gate-all-around (GAA) devices. In a GAA device, a channel region of a single device may include multiple layers of semiconductor material physically separated from one another. In some embodiments, a gate of the device is disposed above, alongside, and even between the semiconductor layers of the device. This configuration may place more semiconductor material proximate to the gate and thereby improve the control of carriers through the channel region. In turn, GAA devices allow more aggressive gate length scaling for both performance and density improvement over typical FinFET devices. On the other hand, a GAA FET device presents higher processing challenges as various structures are formed within the confined spaces between the semiconductor layers. In that regard, the method described herein are particularly beneficial to GAA FET devices due to the ability to use ultra-thin p-type work function layers.

FIGS. 3A-3I are diagrammatic fragmentary cross-sectional side views of a fin-based IC device 100 that includes multiple GAA devices, in portion or entirety, at various fabrication stages (such as those associated with method 10 in FIG. 1) according to various aspects of the present disclosure. In other words, FIGS. 3A-3I illustrate a special situation of what has already been described in FIGS. 2A-2N. Accordingly, the reference numerals and/or letters are repeated to show the same or similar components as those described above; and some descriptions of the same or similar components in FIGS. 3A-3I are abbreviated or omitted for the sake of clarity.

Figure 3A:
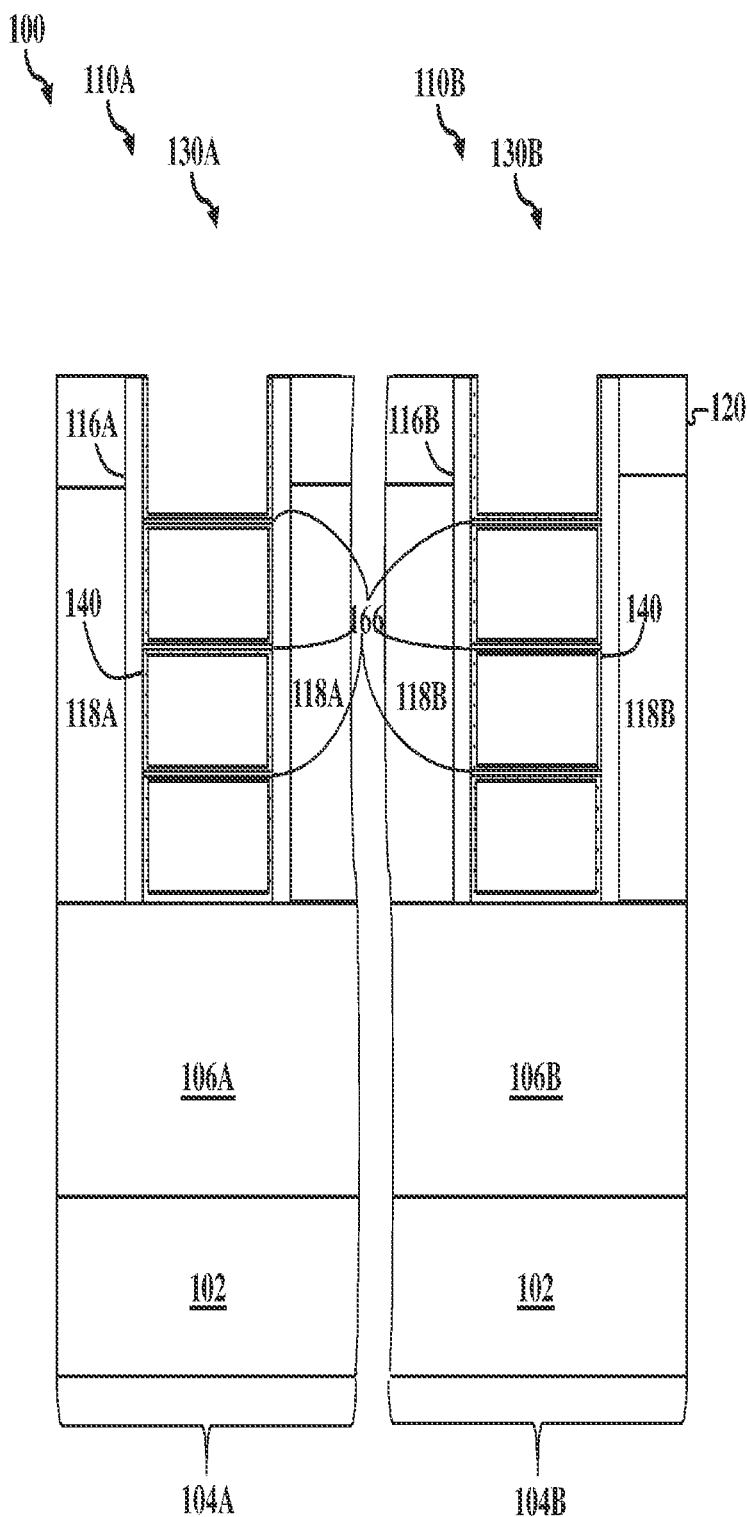
FIGS. 3A-3I are fragmentary diagrammatic views of a GAA device, in portion or entirety, at various fabrication stages, such as those associated with the method of FIG. 1, according to various aspects of the present disclosure.

As illustrated in FIG. 3A, an initial structure for the fin-based IC device 100 includes a gate structure 110A disposed in an n-type region 104A, and a gate structure 110B disposed in a p-type region 104B. Gate structures 110A and 110B each includes multiple semiconductor layers 166 that are stacked vertically over one another (with additional layers in between). Additional descriptions of a GAA device structure and the method of forming a GAA device structure may be found in other GAA-related patents, for example, U.S. Pat. No. 9,754,840, filed on Nov. 16, 2015, and entitled "Horizontal Gate-All-Around Device Having Wrapped-Around Source And Drain", the content of which is hereby incorporated by reference in its entirety. Those descriptions may be referenced to in understanding the present embodiments. In one embodiment, the gate structures 110A and 110B may include a gate dielectric layer 140 conformally formed over each of the semiconductor layers 166 and the sidewalls of openings 130A and 130B. Various steps may be used to improve the qualities of the gate dielectric layer 140, as described above.

Figure 3B:
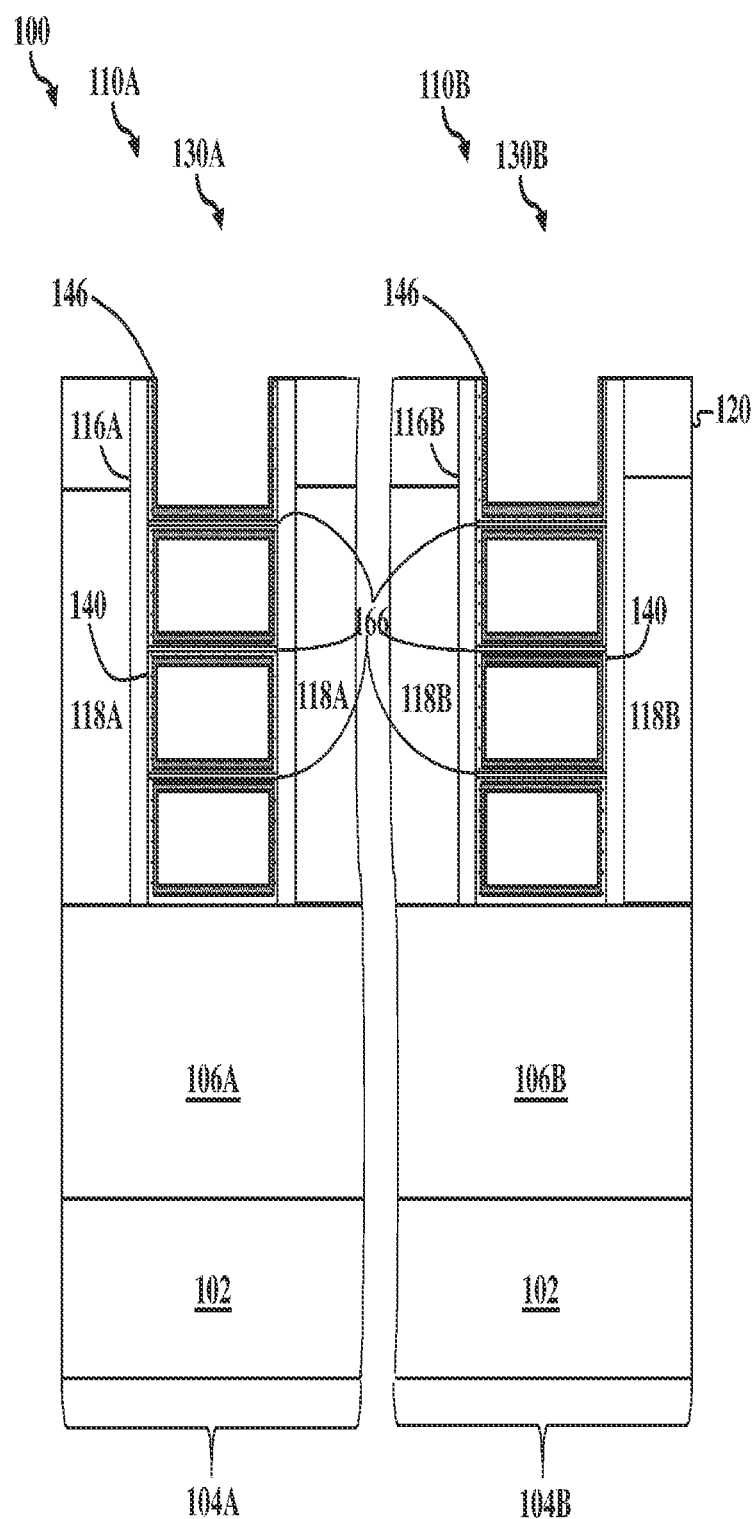
Figure 3C:
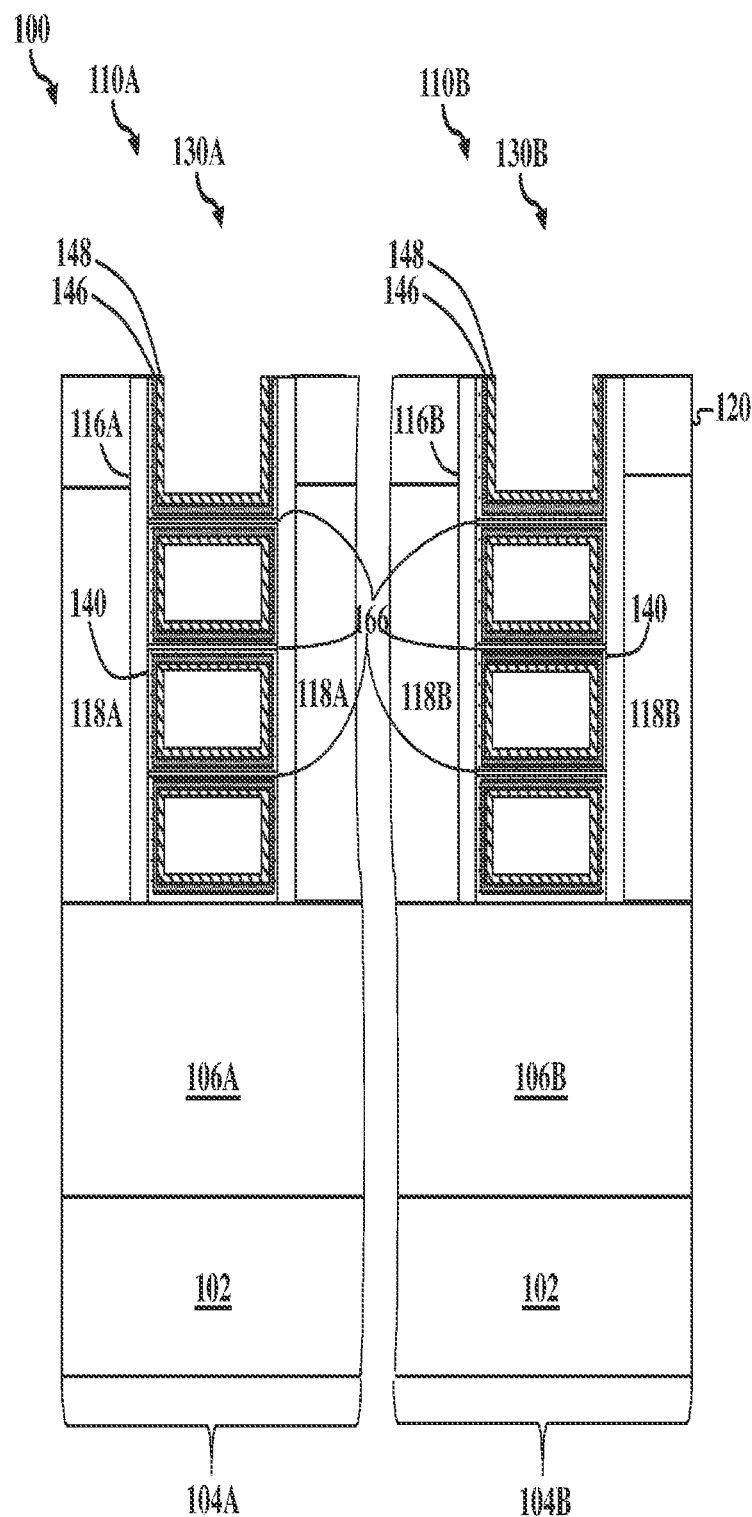
Figure 3D:
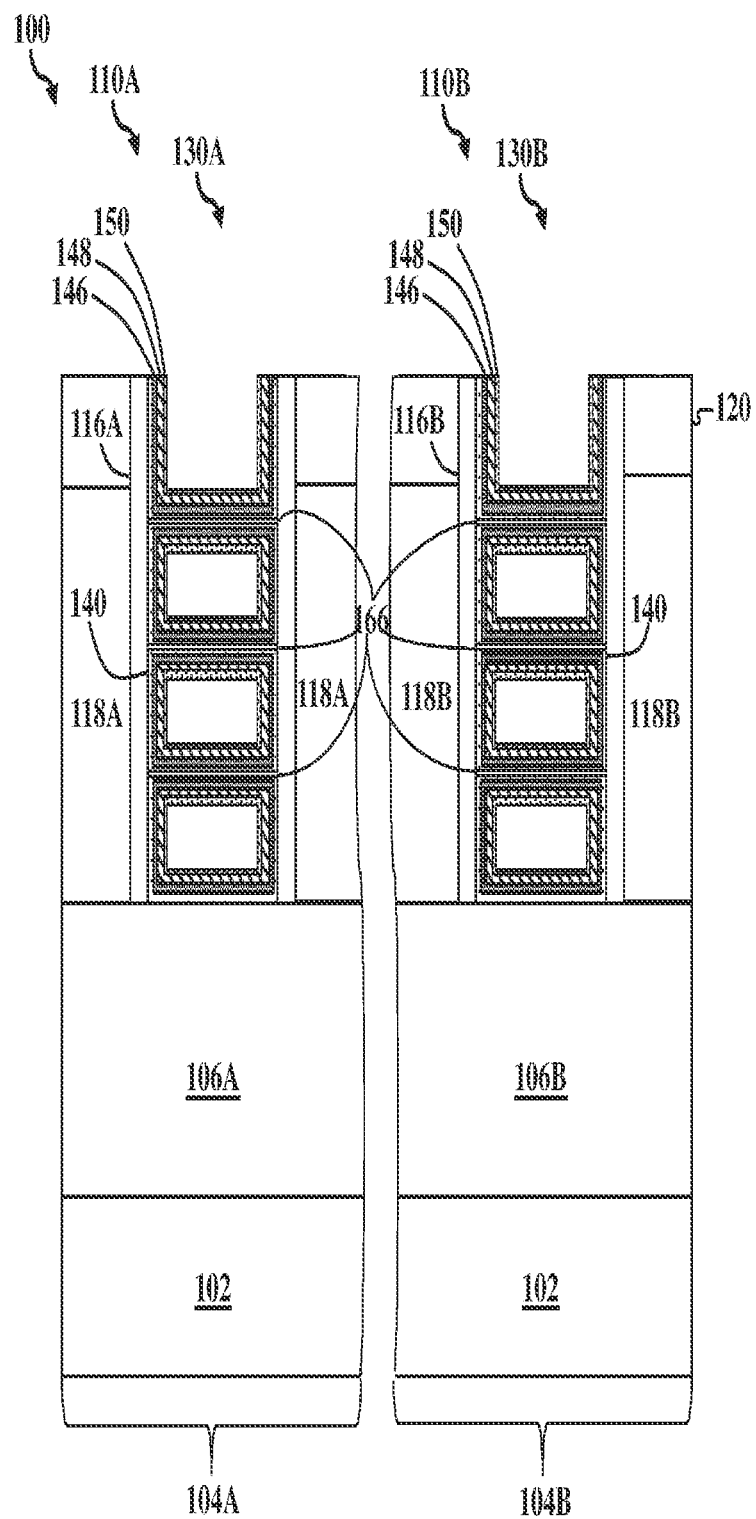

Turning to FIG. 3B, a layer 146 may be formed conformally in the openings 130A and 130B. Various steps (such as etching back steps) may be used to precisely control the thickness of the layer 146, and to prepare a surface free from oxides, as described above. In one embodiment, the layer 146 has a thickness of about 1 Å to about 3 Å, and is formed over each of the semiconductor layers 166. Turning to FIG. 3C, an n-type work function layer 148 is formed in the openings 130A and 130B. The n-type work function layers may be formed by an in-situ conformal deposition such that it has a substantially uniform thickness of about 10 Å to about 15 Å over each of the semiconductor layers 166. Turning to FIG. 3D, a layer 150 is formed in-situ over the n-type work function layer 148. As described above, the layer 150 may be a single layer, or alternatively, may include multiple sub-layers. The layer 150 protects the n-type work function layer 148 in subsequent processing.

Figure 3E:
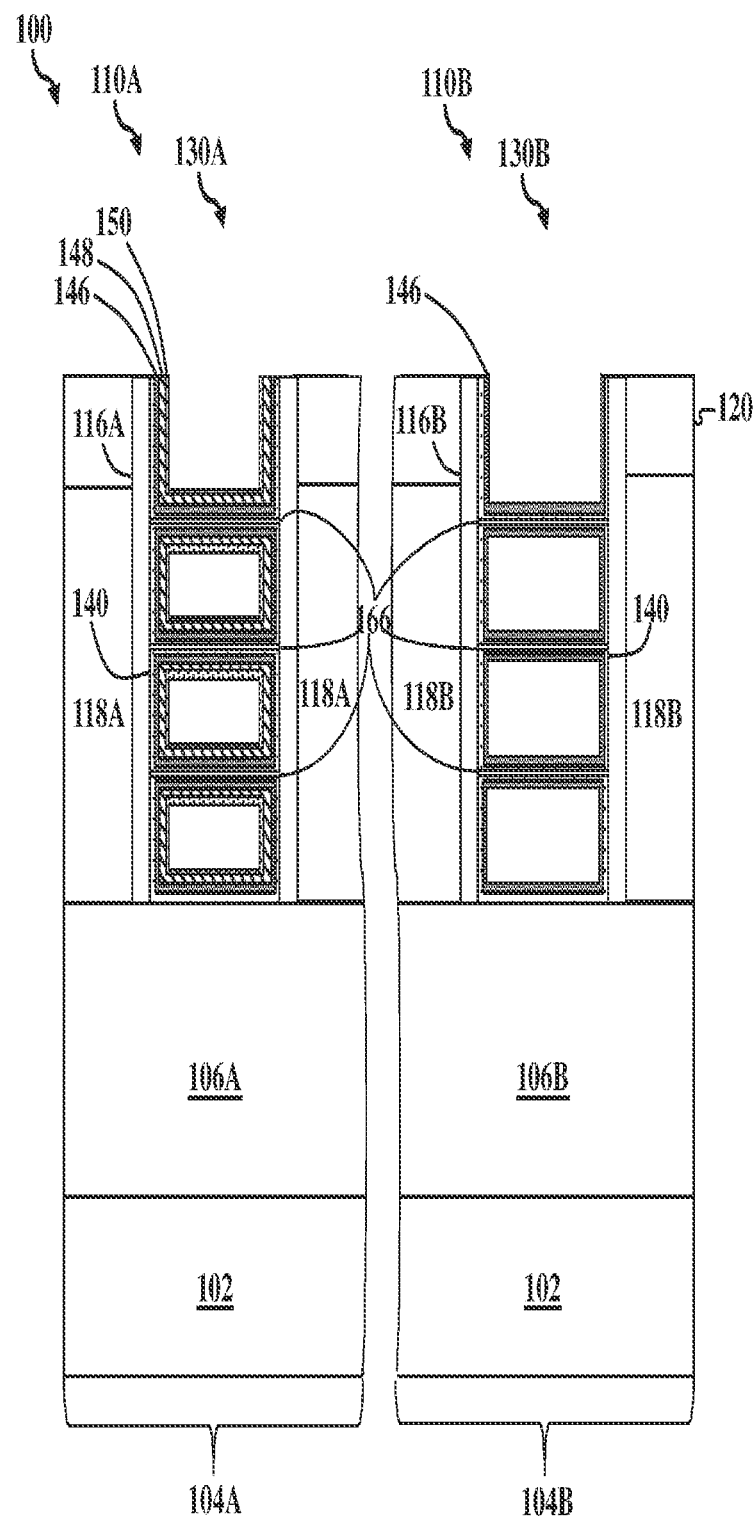

Turning to FIG. 3E, the layers 150 and 148 are removed from the p-type region 104B. For example, photolithography is conducted to cover the n-type regions 104A while exposing the p-type region 104B. An etching process follows to remove the layer 150 and the n-type work function layer 148 from the exposed p-type region 104B, thereby exposing the underlying layer 146. Meanwhile, the n-type region 104A is not affected. The etching process may use any suitable methods.

Figure 3F:
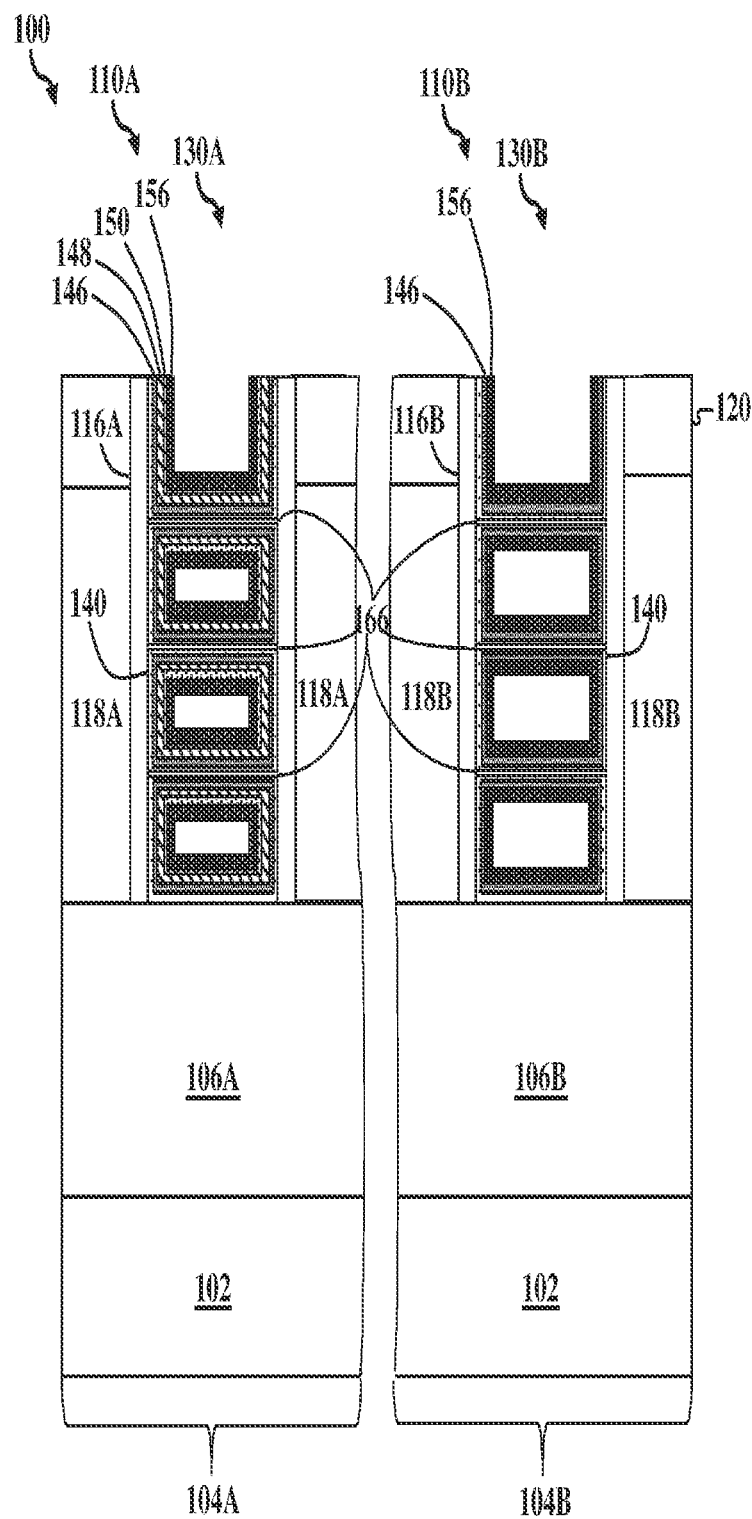

Turning to FIG. 3F, a p-type work function layer 156 is formed in the openings 130A and 130B. The p-type work function layer 156 may be formed to be in direct contact with the layer 150 in the n-type region 104A, while be in direct contact with the layer 146 in the p-type region 104B. The p-type work function layer 156 may be formed conformally such that it has a substantially uniform thickness. In one embodiment, the p-type work function layer 156 may include Ru and/or Ir. As described above, using Ru and/or Ir allows the p-type work function layer 156 to have a smaller thickness as compared to conventional p-type work function materials (e.g., TiN). For example, the p-type work function layer 156 containing Ru may be of a thickness between about 10 Å and about 15 Å.

Figure 3G:
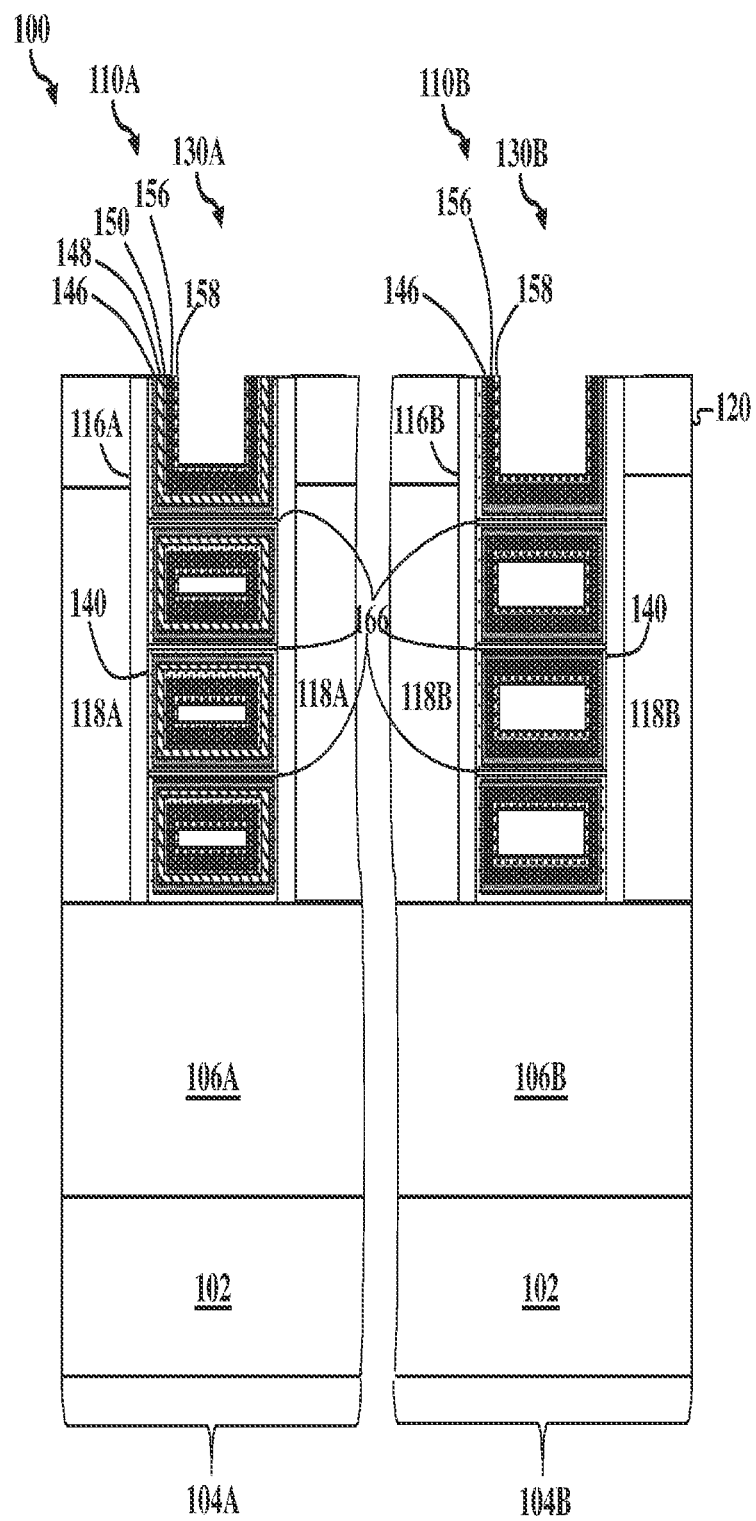
Figure 3H:
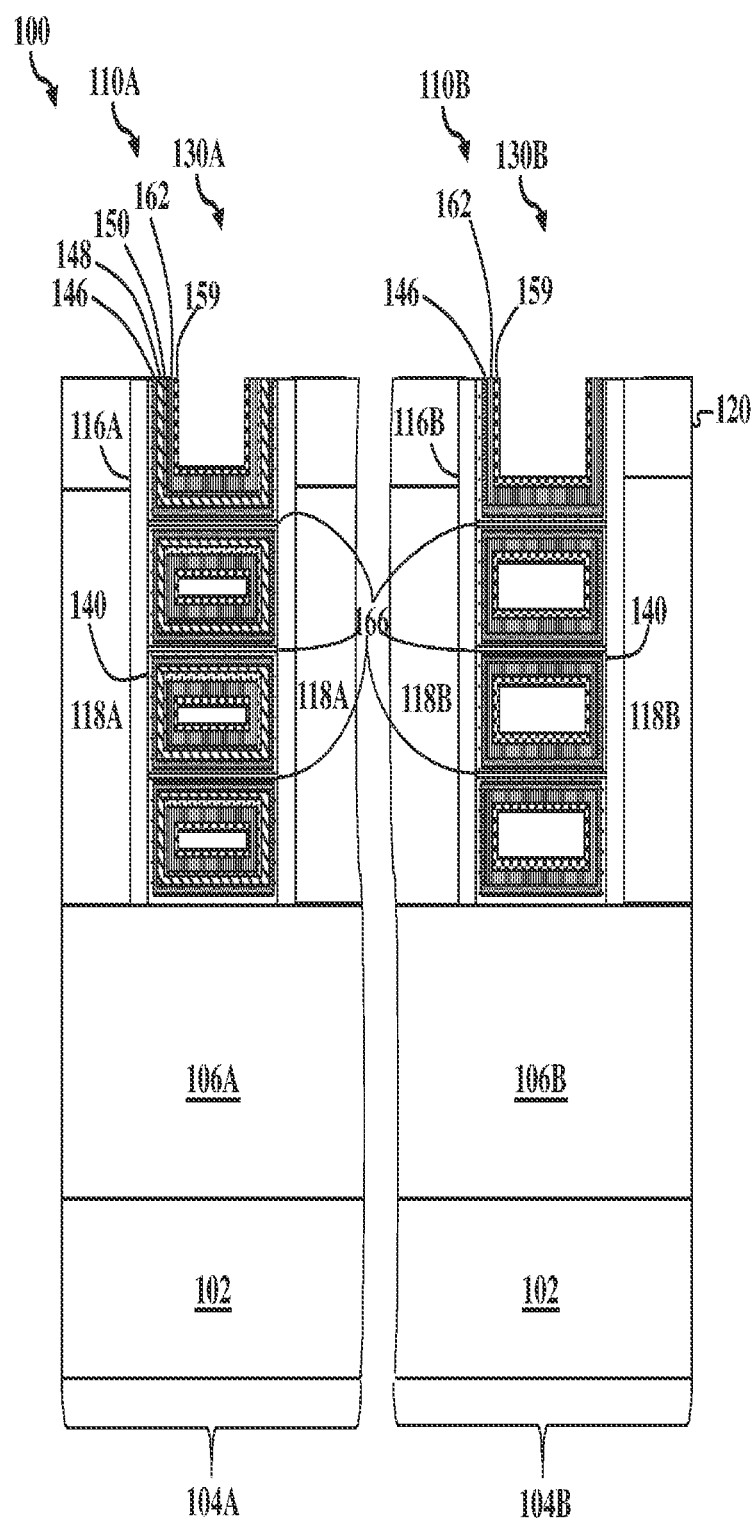

Turning to FIG. 3G, a capping layer 158 is formed in-situ over the p-type work function layer 156. The capping layer may protect the p-type work function layer 156 when the device is exposed to the atmospheric environment. The capping layer 158 may have a thickness of about 5 Å and about 15 Å. Turning to FIG. 3H, an ex-situ oxygen plasma treatment process is conducted on the GAA devices. The ex-situ oxygen plasma treatment process converts at least a portion of the p-type work function layer 156 into a p-type work function layer 162. Meanwhile, the process also converts at least a portion of the capping layer 158 into the capping layer 159. In one embodiment, the p-type work function layer 156 includes Ru and/or Ir. The p-type work function layer 162 thus formed includes $RuO_2$ and/or $IrO_2$. As described above, by adjusting the conditions of the ex-situ oxygen plasma treatment process, the relative concentrations of Ru and/or Ir versus that of $RuO_2$ and/or $IrO_2$ may be tuned. Since $RuO_2$ and $IrO_2$ each has a higher work function than Ru and Ir, respectively, this tuning process allows a higher work function of the metal electrode to be reached. As a result, the formed GAA devices may feature an ultra-low threshold voltage.

Figure 3I:
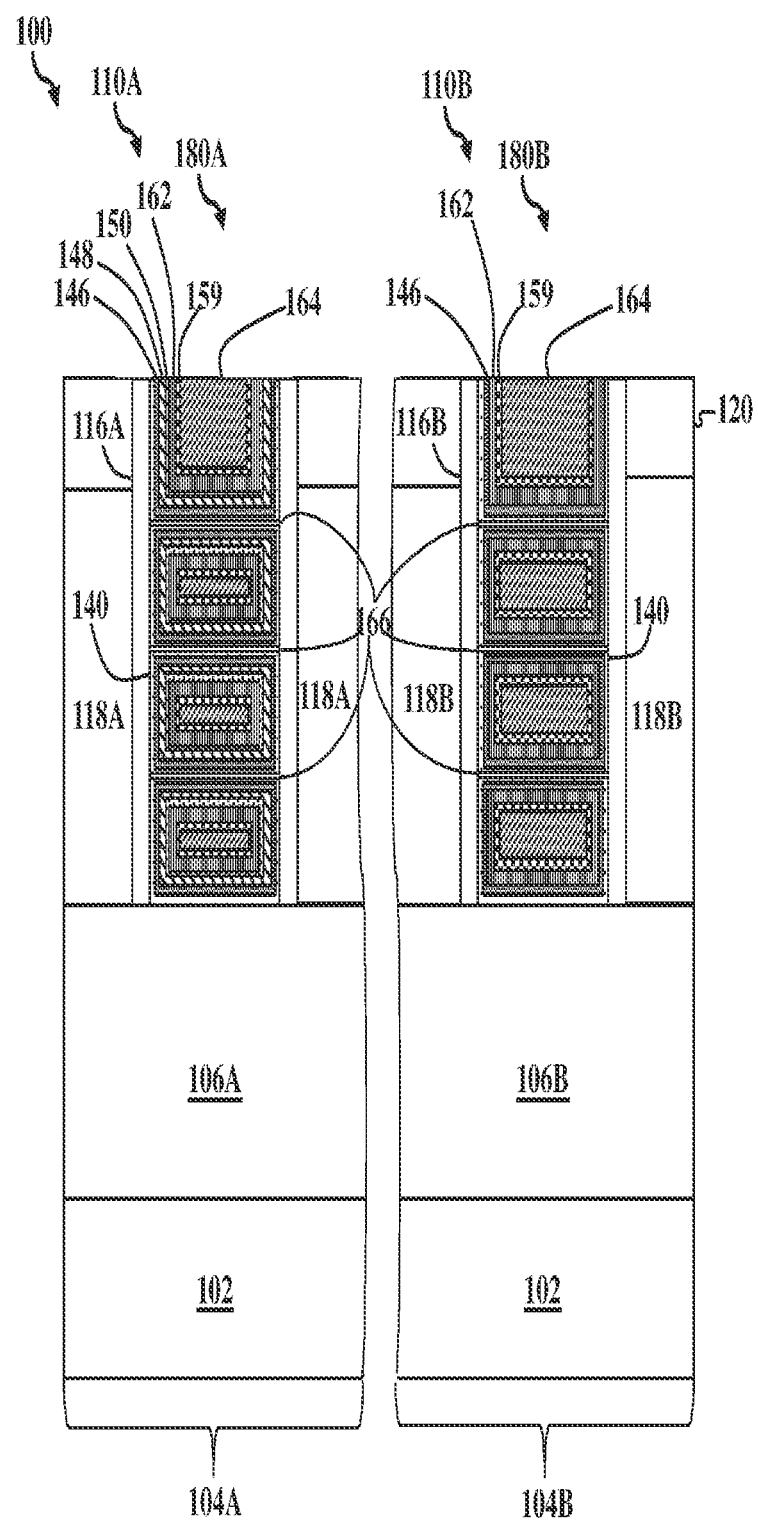

Turning to FIG. 3I, a metal fill layer 164 may be formed (e.g. by deposition and CMP) to complete the fabrication of the GAA devices 180A and 180B. As illustrated in FIG. 3I, the GAA devices have fins comprising multiple semiconductor layers 166. Multiple additional layers are formed around the semiconductor layers 166. For example, the semiconductor layers 166 as part of the gate structure 110A in the n-type region are surrounded by a gate dielectric layer 140, a layer 146, an n-type work function layer 148, a layer 150, a p-type work function layer 162 (or p-type work function layer 156, if the oxygen plasma treatment is omitted), a capping layer 159 (or a capping layer 158, if the oxygen plasma treatment is omitted), and a metal fill layer 164. Similarly, the semiconductor layers 166 as part of the gate structure 110B in the p-type region are also surrounded by a gate dielectric layer 140, a layer 146, a p-type work function layer 162 (or p-type work function layer 156, if the oxygen plasma treatment is omitted), a capping layer 159 (or a capping layer 158, if the oxygen plasma treatment is omitted), and a metal fill layer 164.

The figures and the description above illustrate embodiments where the gate dielectric layer 140, the layer 146, the n-type work function layer 148, the layer 150, the p-type work function layer 162 (or 158) and the capping layer 159 (or 158) each form around each of the semiconductor layers 166. However, the disclosure is not so restricted. In some other embodiments (not shown), one or more of these layers may be formed around only a subset of the semiconductor layers 166.

The present disclosure provides a novel method of forming low-threshold voltage IC devices. For example, this disclosure provides an IC fabrication method that forms the n-type work function layer prior to the p-type work function layer. For another example, this disclosure provides a fabrication method that forms a device with a p-type region substantially free of n-type work function materials. For yet another example, this disclosure provides a method to fabricate a device with a ruthenium-based p-type work function layer. For a further example, this disclosure provides a method to fabricate a device with a metal oxide-based p-type work function layer. For an even further example, this disclosure provides a method to fabricate GAA FET devices with a low threshold voltage.

Based on the discussions above, it can be seen that the various embodiments of the present disclosure offer advantages. It is understood, however, that different embodiments may have different advantages, not all advantages are necessarily described herein, and no particular advantage is necessarily required of any embodiment. In one aspect, by removing the n-type work function layer from the p-type region, the present method avoids undesirable increase in the threshold voltage caused by the diffusion of n-type materials into the p-type work function layer in the p-type region. In another aspect, by using ruthenium as the p-type work function material, the method avoids the need for a thick p-type work function layer (which is often required for other type of materials, such as TiN, to reach the required high work function), thereby widening the gate filling window. In yet another aspect, by using ex-situ conversion of the ruthenium-based work function material into ruthenium oxides-based work function material, the method achieves enhanced material stability against oxygen impact, thus achieving improved device reliability.

Furthermore, fabrication can proceed to complete fabrication of IC device 100. For example, various contacts can be formed to facilitate operation of FinFET devices 170A and 170B (or GAA FET devices 180A and 180B). For example, one or more ILD layers, similar to ILD layer 120, can be formed over substrate 102 (in particular, over ILD layer 120 and gate structures 110A and 110B). Contacts can then be formed in ILD layer 120 and/or ILD layers disposed over ILD layer 120. For example, contacts are respectively electrically coupled with gate structures 110A and 110B (particularly, gate electrodes of gate structures 110A and 110B), and contacts are respectively electrically coupled to source/drain regions (particularly, epitaxial source/drain features 118A and 118B). Contacts include a conductive material, such as a metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layers disposed over ILD layer 120 and the contacts (for example, extending through ILD layer 120 and/or the other ILD layers) are a portion of an MLI feature disposed over substrate 102, as described above. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form the MLI feature.

The present disclosure provides for many different embodiments. Methods for preparing semiconductor devices, such as field effect transistor devices with low threshold voltages, are disclosed herein. One aspect of the present disclosure involves a method of manufacturing a semiconductor device. The method comprises providing a substrate having a first region and a second region. An n-type work function layer is formed over the substrate in the first region but not in the second region. A p-type work function layer is formed over the n-type work function layer in the first region, and over the substrate in the second region. The p-type work function layer directly contacts the substrate in the second region. And the p-type work function layer includes a metal oxide. In some embodiments, the forming of the n-type work function layer includes forming a first layer containing tantalum and nitrogen over a gate dielectric layer; etching back the first layer; and depositing the n-type work function layer over the etched back first layer. In some embodiments, the forming of the n-type work function layer includes forming the n-type work function layer over the substrate in both the first region and the second region; and patterning and removing the n-type work function layer in the second region but not in the first region. In some embodiments, the forming of the p-type work function layer includes forming a metal layer over the n-type work function layer; and converting the metal layer into a metal oxide layer. In some embodiments, the forming of the metal layer includes forming a ruthenium layer with triruthenium dodecacarbonyl ($Ru_3(CO)_{12}$) and hydrogen ($H_2$) as precursors by an in-situ ALD deposition at a temperature of about 100° C. to about 200° ° C. and at a total pressure of about 5 torr to about 15 torr; and tuning a thickness of the ruthenium layer by adjusting a process time of the in-situ ALD deposition. In some embodiments, the converting of the metal layer includes conducting an oxygen plasma treatment of the metal layer. In some embodiments, the oxygen plasma treatment is conducted at a temperature between about 160° C. to about 250° C. and with an oxygen flow rate of about 2,000 standard cubic centimeters per minute (sccm) to about 6,000 sccm. In some embodiments, the method further comprises forming a capping layer over the p-type work function layer, and the oxygen plasma treatment is conducted through the capping layer. In some embodiments, the forming of the metal layer includes pre-cleaning a surface of the capping layer. The pre-cleaning includes partially etching-back the capping layer with a chemical selected from tantalum pentachloride ($TaCl_5$) and tungsten pentachloride ($WCl_5$) at a processing temperature of about 300° C. to about 500° C., and at a total pressure of about 5 torr to about 15 torr. In some embodiments, the forming of the capping layer includes depositing a tantalum nitride (TaN) layer by an Atomic Layer Deposition (ALD) method with pentakis(dimethylamino) tantalum (PDMAT) and ammonia ($NH_3$) at a temperature between about 225° C. and about 275° C.; and tuning a thickness of the capping layer by adjusting a cycle number of the ALD method. In some embodiments, the substrate includes a semiconductor structure having a plurality of semiconductor layers that are vertically stacked over one another. The n-type work function layer is formed over a first semiconductor layer of the plurality of semiconductor layers, and the p-type work function layer in the second region directly contacts the first semiconductor layer.

Another aspect of the present disclosure involves a method to manufacture an integrated circuit (IC) device. A first gate structure is disposed over a first fin structure and a second gate structure is disposed over a second fin structure. A first opening is formed in the first gate structure and a second opening is formed in the second gate structure. A gate dielectric layer is formed in the first and the second openings. An n-type work function layer is formed in the first and the second openings. The n-type work function layer in the second opening, but not the n-type work function layer in the first opening, is removed. A p-type work function layer is formed in the first and the second openings. A metal fill layer is formed over the p-type work function layer in the first and the second openings. The p-type work function layer includes a metal oxide. In some embodiments, the p-type work function layer includes ruthenium oxide. In some embodiments, the forming of the p-type work function layer includes forming a metal layer; forming a capping layer over the metal layer; and treating the metal layer through the capping layer with an oxygen plasma. In some embodiments, the forming of the gate dielectric layer includes forming a capping layer over the gate dielectric layer; performing an annealing process; and removing the capping layer.

A further aspect of the present disclosure involves a device. The device comprises a substrate including a semiconductor material; a first gate structure in an n-type region of the substrate; and a second gate structure in a p-type region of the substrate. The first gate structure includes a p-type work function layer deposited over an n-type work function layer. The second gate structure includes the p-type work function layer deposited over and directly contacting the substrate. The p-type work function layer includes ruthenium oxide ($RuO_2$). In some embodiments, the second gate structure includes a capping layer over the p-type work function layer, and the capping layer includes tantalum and nitrogen. In some embodiments, the first gate structure includes a plurality of semiconductor layers, and the n-type work function layer is disposed over the plurality of semiconductor layers. In some embodiments, the p-type work function layer has a thickness between about 10 Å and about 15 Å. In some embodiments, the p-type work function layer includes both ruthenium oxide and unoxidized ruthenium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a first structure that includes:
        a first portion of a substrate;
        a first stack of nano-structures disposed over the first portion of the substrate;
        a first nitrogen-containing layer disposed between the nano-structures in the first stack; and
        a first work function metal layer disposed between the nano-structures in the first stack, wherein the first work function metal layer is separated from the first nitrogen-containing layer by one or more other layers, and wherein the one or more other layers include at least an n-type work function metal layer; and
    a second structure that includes:
        a second portion of the substrate;
        a second stack of nano-structures disposed over the second portion of the substrate;
        a second nitrogen-containing layer disposed between the nano-structures in the second stack, wherein the first nitrogen-containing layer and the second nitrogen-containing layer have substantially similar material compositions; and
        a second work function metal layer disposed between the nano-structures in the second stack, wherein the second work function metal layer and the first work function metal layer have substantially similar material compositions, and wherein the second work function metal layer is in physical contact with the second nitrogen-containing layer.

2. The device of claim 1, wherein:
    the first stack of nano-structures include channels of an n-type gate-all-around (GAA) transistor; and
    the second stack of nano-structures include channels of a p-type (GAA) transistor.

3. The device of claim 1, wherein the first nitrogen-containing layer and the second nitrogen-containing layer each contain titanium nitride (TiN), tantalum nitride (TaN), tungsten nitride (WN), tungsten carbonitride (WCN), titanium silicon nitride (TiSiN), or tantalum silicon nitride (TaSiN).

4. The device of claim 1, wherein:
    the first structure further includes a first fill metal and a first capping layer disposed between the first fill metal and the first work function metal layer;
    the second structure further includes a second fill metal and a second capping layer disposed between the second fill metal and the second work function metal layer;
    the first fill metal and the second fill metal have substantially similar material compositions; and
    the first capping layer and the second capping layer have substantially similar material compositions.

5. The device of claim 1, wherein the first work function metal layer and the second work function metal layer each include a p-type work function metal.

6. The device of claim 5, wherein the p-type work function metal contains an unoxidized metal and a metal oxide.

7. The device of claim 6, wherein:
    the unoxidized metal includes ruthenium; and
    the metal oxide include ruthenium oxide.

8. The device of claim 6, wherein:
    the unoxidized metal includes iridium; and
    the metal oxide include iridium oxide.

9. The device of claim 5, wherein the p-type work function metal contains a metal oxide but no unoxidized metal.

10. The device of claim 9, wherein the metal oxide includes ruthenium oxide or iridium oxide.

11. A device, comprising:
    an n-type gate-all-around (GAA) transistor that includes:
        a first active region;
        a first stack of semiconductor nano-layers disposed over the first active region;
        a first nitrogen-containing layer disposed between the semiconductor nano-layers in the first stack;

a first work function metal layer disposed between the semiconductor nano-layers in the first stack, wherein the first work function metal layer contains a p-type work function metal; and one or more additional layers disposed between the first nitrogen-containing layer and the first work function metal layer; and a p-type GAA transistor that includes:
a second active region;
a second stack of semiconductor nano-layers disposed over the second active region;
a second nitrogen-containing layer disposed between the semiconductor nano-layers in the second stack, wherein the first nitrogen-containing layer and the second nitrogen-containing layer include a same type of nitrogen-containing material; and
a second work function metal layer disposed between the semiconductor nano-layers in the second stack and in direct contact with the second nitrogen-containing layer, wherein the second work function metal layer also contains the p-type work function metal.

12. The device of claim 11, wherein at least some of the one or more additional layers do not contain the p-type work function metal.

13. The device of claim 11, wherein the first nitrogen-containing layer and the second nitrogen-containing layer each contain titanium nitride (TiN), tantalum nitride (TaN), tungsten nitride (WN), tungsten carbonitride (WCN), titanium silicon nitride (TiSiN), or tantalum silicon nitride (TaSiN).

14. The device of claim 11, wherein the one or more additional layers contain Ti, Al, Ag, Mn, Zr, TiAl, TiAlC, TaC, TaCN, TaSiN, TaAl, TaAlC, or TiAlN.

15. The device of claim 11, wherein the p-type work function metal contains an unoxidized metal and a metal oxide.

16. The device of claim 15, wherein:
the unoxidized metal includes ruthenium or iridium; and
the metal oxide include ruthenium oxide or iridium oxide.

17. The device of claim 11, wherein the p-type work function metal consists of ruthenium oxide or iridium oxide.

18. A device, comprising:
an n-type gate-all-around (GAA) transistor that includes:
a first layer that contains titanium nitride (TiN), tantalum nitride (TaN), tungsten nitride (WN), tungsten carbonitride (WCN), titanium silicon nitride (TiSiN), or tantalum silicon nitride (TaSiN);
a first p-type work function metal layer; and
an n-type work function metal layer disposed between the first layer and the first p-type work function metal layer, wherein the n-type work function metal layer contains Ti, Al, Ag, Mn, Zr, TiAl, TiAlC, TaC, TaCN, TaSiN, TaAl, TaAlC, or TiAlN; and
a p-type GAA transistor that includes:
a second layer having a same material composition as the first layer; and
a second p-type work function metal layer that is in direct physical contact with the second layer, wherein the second p-type work function metal layer has a same material composition as the first p-type work function metal layer.

19. The device of claim 18, wherein the first p-type work function metal layer and the second p-type work function metal layer each include ruthenium oxide or iridium oxide.

20. The device of claim 19, wherein the first p-type work function metal layer and the second p-type work function metal layer are each free of unoxidized metals.

* * * * *